US012581590B1

(12) United States Patent
Wink et al.

(10) Patent No.: US 12,581,590 B1
(45) Date of Patent: Mar. 17, 2026

(54) HIGH DENSITY RADIO FREQUENCY CONNECTIONS

(71) Applicant: Lockheed Martin Corporation, Bethesda, MD (US)

(72) Inventors: Timothy Patrick Wink, Castle Rock, CO (US); Frank Lucchesi, Burnsville, MN (US); Bradley Frank Allen, Denver, CO (US); Nathan Jastram, Highlands Ranch, CO (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 84 days.

(21) Appl. No.: 18/443,508

(22) Filed: Feb. 16, 2024

Related U.S. Application Data

(60) Provisional application No. 63/593,846, filed on Oct. 27, 2023.

(51) Int. Cl.
H05K 1/02 (2006.01)
H01P 3/08 (2006.01)
(Continued)

(52) U.S. Cl.
CPC ............. H05K 1/0243 (2013.01); H01P 3/08 (2013.01); H01Q 1/50 (2013.01);
(Continued)

(58) Field of Classification Search
CPC ... H05K 1/02; H05K 1/04; H05P 3/08; H01Q 1/50; H01Q 21/00; H01Q 3/26
See application file for complete search history.

(56) References Cited

U.S. PATENT DOCUMENTS 5,212,462 A * 5/1993 Gomez-Henry ........ H01P 5/187
 333/24 C
6,184,757 B1 * 2/2001 Rosenthal ................. H01P 1/30
 333/260

(Continued)

OTHER PUBLICATIONS

Jazani, Ghoncheh et al., "Design Of Dual-Polarized (RHCP/LHCP) Quad-Ridged Horn Antenna With Wideband Septum Polarizer Wave Guide Feed," IET Microwaves, Antennas & Propagation, vol. 12, Iss. 9, pp. 1541-1545, 2018.

(Continued)

*Primary Examiner* — Thien M Le

(57) ABSTRACT

Provided herein are various enhancements for coupling radio frequency signals among components of aperture antenna arrays and electronically steered arrays (ESAs). An apparatus is provided having a first printed circuit board comprising stripline links arranged to carry radio frequency signals routed to a connector configured to couple to a mating connector on a second printed circuit board. Connections of the connector are arranged to carry the radio frequency signals to the second printed circuit board using at least a connection arrangement having a perimeter of radio frequency ground connections surrounding a set of radio frequency connections configured to carry the radio frequency signals, with each of the radio frequency connections of the set spaced apart within the perimeter by additional instances of the radio frequency ground connections such that a target signal isolation among individual ones of the radio frequency signals is established.

18 Claims, 11 Drawing Sheets

(51) Int. Cl.

| | | |
|---|---|---|
| *H01Q 1/50* | (2006.01) |
| *H01Q 21/00* | (2006.01) |
| *H05K 1/14* | (2006.01) |
| *H01Q 3/26* | (2006.01) |

(52) U.S. Cl.
CPC .......... *H01Q 21/0075* (2013.01); *H05K 1/14* (2013.01); *H01Q 3/26* (2013.01); *H05K 2201/10098* (2013.01)

(56) References Cited

U.S. PATENT DOCUMENTS

| | | | |
|---|---|---|---|
| 10,320,085 B1 | 6/2019 | Lier et al. | |
| 10,749,252 B1 | 8/2020 | Lier et al. | |
| 2005/0035825 A1* | 2/2005 | Carson | H01Q 21/0025 |
| | | | 333/117 |
| 2005/0104791 A1 | 5/2005 | Sun et al. | |
| 2006/0164301 A1* | 7/2006 | Falk | C07D 473/00 |
| | | | 342/377 |
| 2010/0245202 A1* | 9/2010 | Lewis | H01Q 23/00 |
| | | | 343/859 |
| 2013/0163627 A1* | 6/2013 | Seurin | H01S 5/02345 |
| | | | 372/36 |
| 2015/0347760 A1* | 12/2015 | Kruglick | G06F 21/76 |
| | | | 726/25 |
| 2015/0357760 A1* | 12/2015 | Aihara | H05K 1/115 |
| | | | 439/55 |
| 2017/0125380 A1* | 5/2017 | Han | H01L 23/5386 |
| 2018/0159214 A1* | 6/2018 | Zolomy | H01Q 21/28 |

OTHER PUBLICATIONS

Ordek, Sezgin et al., "Horn Array Antenna Design For Ku-Band Applications," 2015 9th International Conference on Electrical and Electronics Engineering, pp. 351-354, Nov. 26-28, 2015.

Silver, Samuel, "Microwave Antenna Theory And Design," First Edition, 10.15 The Box Horn,, pp. 377-380, 1949.

Vettikalladi, Hamsakutty et al., "High Gain And High Efficient Stacked Antenna Array With Integrated Horn For 60 GHZ Communication Systems," International Journal of Antennas and Propagation, vol. 2014, 9 pages, Apr. 22, 2014.

Young, Leo et al., "Meander-Line Polarizer," IEEE Transactions on Antennas and Propagation, pp. 376-378, May 1973.

Zhang, J. C. et al., "Multifunctional Meander Line Polarizer," Progress in Electromagnetics Research Letters, vol. 6, pp. 55-60, 2009.

* cited by examiner

HIGH DENSITY RADIO FREQUENCY CONNECTIONS

RELATED APPLICATIONS

This application hereby claims the benefit of and priority to U.S. Provisional Patent Application 63/593,846 that was filed on Oct. 27, 2023, and is entitled "HIGH DENSITY RADIO FREQUENCY CONNECTIONS."

TECHNICAL BACKGROUND

Various radio frequency (RF) antenna arrangements have been developed for microwave frequency applications, such as use on space-deployed satellites or spacecraft for communications and sensing. Microwave RF transmission systems can employ arrays of dozens or hundreds of antenna elements, useful for applications such as active and passive electronically-steerable arrays (ESAs). When both transmit (Tx) and receive (Rx) functionality is desired from ESAs, separate Tx and Rx antenna arrays are typically employed that which incorporate physically separate sets of antenna apertures, polarizers, and waveguide filters and entire ESAs, in entirety, which then may require additional RF shielding or 'fences', RF absorber materials, and other spacecraft structural accommodations between the separate arrays to mitigate co-site self-interference. This arrangement can lead to much greater part count, size and mass/weight, which can be significant on space-deployed satellite systems.

Moreover, in typical ESA designs, coaxial links and coaxial connectors are employed to interconnect various RF components, such as to couple among combining networks, beamforming elements, amplifiers, filters, and other various components. Due to the increasing number of individual antenna elements in ESAs and the use of separate Tx/Rx ESAs, coaxial interconnect of RF signals among various components in antenna systems becomes untenable. Some of the challenges facing ESA designs that use numerous coaxial connectors, coaxial cables and connections include unwanted phase and amplitude tracking errors associated with temperature, matching, and routing sensitivity, in coaxial cables. Moreover, long assembly times are required to custom manufacture, install, and route many hundreds of cables in a large RF system with more than a few beams. Also, high insertion forces and poor alignment and stack up tolerances using individual coaxial connections limits the ability to make many simultaneous RF mating connections which contributes to phase and amplitude tracking errors in ESA systems. The high part counts associated with coaxial connections increase complexity, size, weight, power, and cost, as well as introduces challenges in individual cable assembly, routing, tuning, and manufacturing testing. Furthermore, bends and angles in coaxial cables can contribute to phase tracking errors, especially among the multitude of coaxial connections employed in large ESA designs.

SUMMARY

The enhanced example implementations provided herein establish "full duplex" ESA operations having simultaneous Tx and Rx capability from a single shared Tx/Rx ESA assembly. The ESA assembly can be formed from several modular subarrays, with RF signaling coupled throughout various subassemblies using high-speed high-density digital connectors instead of coaxial links. These implementations provide overall smaller form factors, increased integration, and lower masses than traditional ESA designs. Moreover, full duplex ESAs, as described herein, can provide independent shapable/steerable and simultaneous operation of 32 concurrent beams, comprising sixteen (16) or more Tx left-hand circularly polarized (LHCP) beams and sixteen (16) or more Rx right-hand circularly polarized (RHCP) beams (or vice versa). Moreover, the full duplex ESA discussed herein can provide four (4) geolocation beam outputs.

In one example implementation, an apparatus is provided having a first printed circuit board comprising stripline links arranged to carry radio frequency signals routed to a connector configured to couple to a mating connector on a second printed circuit board. Connections of the connector are arranged to carry the radio frequency signals to the second printed circuit board using at least a connection arrangement having a perimeter of radio frequency ground connections surrounding a set of radio frequency connections configured to carry the radio frequency signals, with each of the radio frequency connections of the set spaced apart within the perimeter by additional instances of the radio frequency ground connections such that a target signal isolation among individual ones of the radio frequency signals is established.

In another example implementation, a method of coupling radio frequency signaling among printed circuit boards is provided. The method includes, on a first printed circuit board, forming individual stripline links arranged to carry a plurality of radio frequency signals to a connector configured to couple the plurality of radio frequency signals to a mating connector on a second printed circuit board. The connector comprises a connection arrangement having a perimeter of radio frequency ground connections surrounding a set of radio frequency connections configured to carry the plurality of radio frequency signals, with each of the radio frequency connections of the set spaced apart within the perimeter by additional instances of the radio frequency ground connections such that a target signal isolation among individual ones of the plurality of radio frequency signals is established.

In yet another example, an antenna subarray is provided having a printed circuit board comprising stripline links arranged to carry a set of radio frequency signals from a connector to beamforming circuitry configured to drive a plurality of aperture antennas. The connector comprises a connection arrangement having a perimeter of radio frequency ground connections surrounding the set of radio frequency connections, with each of the radio frequency connections of the set spaced apart within the perimeter by additional instances of the radio frequency ground connections such that a target signal isolation among individual ones of the set is established.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
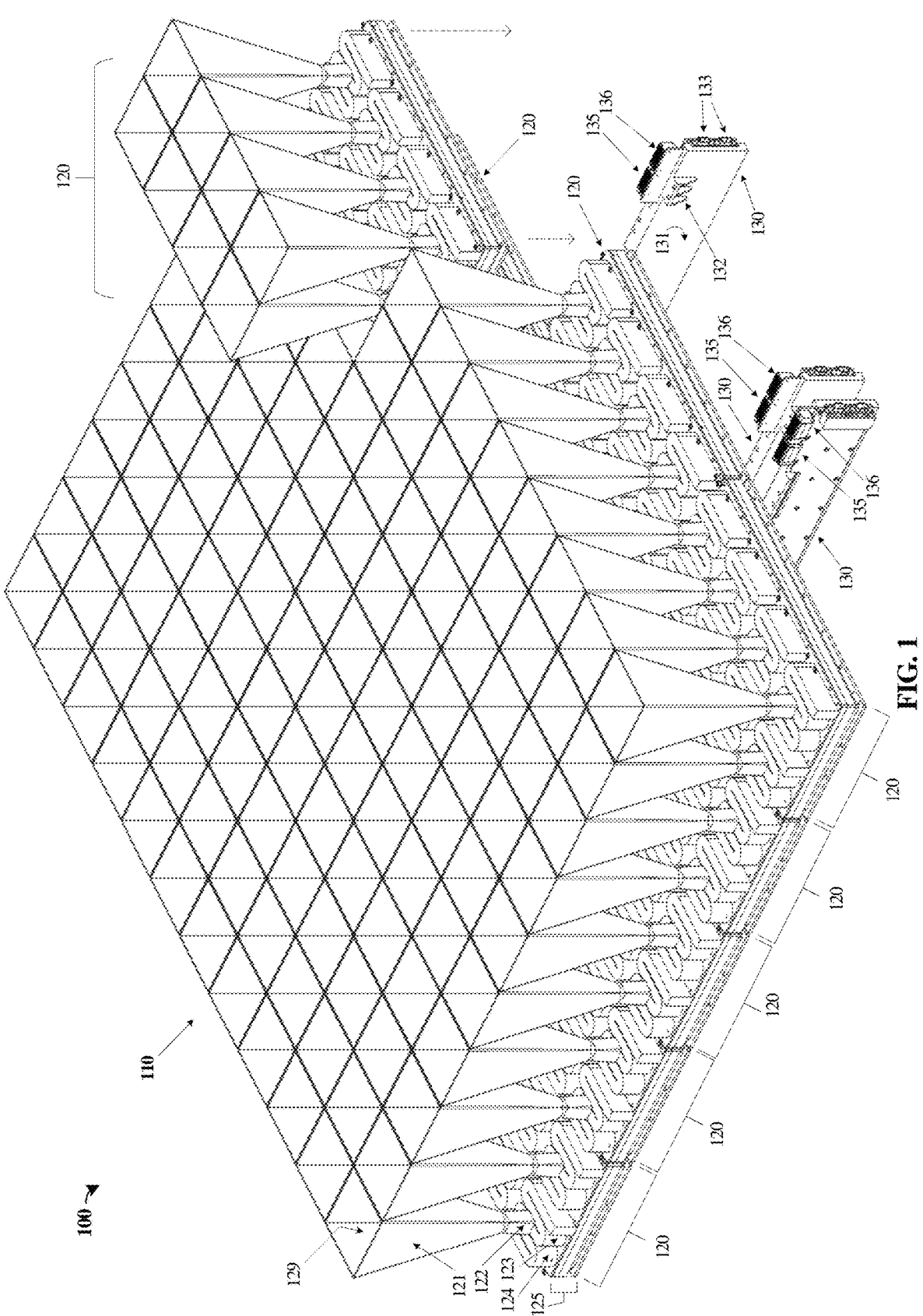
FIG. 1 illustrates an antenna array assembly in an implementation.

Radio frequency antenna assemblies and corresponding aperture arrays can be employed for transmit (Tx) and receive (Rx) operations. One popular RF arrangement is an electronically steerable array (ESA), which has a large array of dozens or hundreds (or more) of individual antenna apertures which can be individually controlled to form multiple shapable beams which may be individually scanned to handle transmissions over selected angular ranges. These array assemblies can be deployed onto any suitable device or vehicle, such as space-deployed satellites or space-faring vehicles, which may use a direct-radiating configuration or a reflector-fed arrangement. Typically, microwave frequency bands are employed in ESAs, with geometries of associated antenna apertures and waveguides scaled to suit the desired frequency ranges, such as the X-band or K-band frequency ranges, among others.

As mentioned above, to handle both Tx and Rx operations, a conventional antenna array might use a half-duplex (time-shared) arrangement where Tx operations occur sequentially with Rx operations (along with intervening blanking time periods), or might employ entirely separate physical instances of Tx and Rx ESA arrays. Both arrangements offer several disadvantages, including complexity in RF control schemes, reduction in usable bandwidth, increased mass and size of having roughly double the RF components, difficulty in manufacturing and integration from potentially hundreds of manually coupled coaxial links in close proximity, and increased power requirements. Moreover, when deployed onto satellites, the added size and weight of two separate Tx and Rx arrays can preclude certain form factors, launch profiles, launch vehicles, and orbital configurations.

Advantageously, the enhanced examples herein include "full duplex" operations having simultaneous Tx and Rx capability from a single shared Tx/Rx ESA assembly, while also having overall smaller form factors, increased integration, and lower masses than traditional ESA designs. The included examples provide enhanced performance, efficiency, manufacturability, and scalability, as well as low RMS phase and amplitude tracking errors. Moreover, a full duplex ESA, as described herein, can provide independent shapable/steerable and simultaneous operation of 32 concurrent beams, comprising sixteen (16) or more Tx left-hand circularly polarized (LHCP) beams and sixteen (16) or more Rx right-hand circularly polarized (RHCP) beams (or vice versa). Moreover, the full duplex ESA discussed herein can provide four (4) geolocation beam outputs designed for emitter locating purposes, leveraging monopulse techniques and narrow beam nulling through advanced beam optimization digital processing. Different quantities of Tx, Rx, and geolocation beams can be provided in other configurations. Also, the various beams can be not only Tx/Rx concurrent, but also allow for precise configuration to match specific requirements for G/T and aggregate EIRP over configurable coverage areas and scan angles. The examples herein also can employ parallel and highly integrated beamformer integrated circuits (BFIC) that supports up to 16 RF inputs/16 RF outputs for transmit and receive functions. The full duplex operation is provided by common/shared apertures among Tx/Rx, and integrated RF transmit/receive modules. Compared to conventional designs, this enhanced arrangement can eliminate an entire ESA resulting in ~50% reduction in size/volume and a corresponding reduction in associated costs.

Also discussed herein are enhanced interconnect architectures, components, and techniques for replacing traditional RF coaxial interconnect with high-speed and high-density digital interconnects for transporting RF signals. These enhanced interconnect architectures, components, and techniques can be applied to any of the example implementations herein. These examples include the use of high-density high-speed digital connectors designed for non-RF signal interconnect, such as digital signal bus interconnect, although the examples herein are not limited to specific connectors. High-density high-speed digital connectors employed for RF signals enable plug-in, line-replaceable units, or ESA tiles, to build scalable or readily repairable ESAs. Moreover, this approach can replace the cumbersome and massive sets of coaxial connections and coaxial cable assemblies with RF strip line circuit cards that better control phase and amplitude variations when compared to coaxial cable assemblies. In addition, vertical (e.g., straight) or angled (e.g., right angle) connector configurations can be achieved using high-density high-speed connectors instead of unwanted or unachievable bending of dozens or hundreds of coaxial RF links. Bending of coaxial links can be troublesome and introduce phase errors, impedance mismatching, and other issues which are avoided by use of the high-density high-speed digital connectors herein.

In typical ESA designs, coaxial links and coaxial connectors are employed to couple various RF sections, such as to couple among antenna apertures, combining networks, beamforming elements, amplifiers, filters, and other various components. Due to the increasing number of individual antenna elements in ESAs, the use of two separate Tx and Rx ESAs in conventional designs, and the beamforming and frequency combinations of RF signals within an ESA, interconnecting RF signals to various components in antenna systems becomes untenable using traditional coaxial RF interconnects. Some of the challenges facing ESA designs that use coaxial connectors and coaxial cable combinations include unwanted phase errors and amplitude tracking errors associated with coaxial cables. Moreover, long assembly times are required to custom manufacture, install, and route many hundreds of cables in a large RF system with more than a few beams, high insertion forces are needed for board-mounted RF coaxial connectors which can limit how many beams can be carried in a single RF interface, and poor alignment and stack up tolerances using individual coax connections limits the ability to make many simultaneous RF mating connections common in beam-formed systems. The high part counts associated with coaxial connections increase complexity, size, weight, power, and cost, as well as introduce challenges in individual cable assembly, routing, tuning, and manufacturing testing. Furthermore, bends and angles in coaxial cables introduces phase tracking errors, especially among the multitude of connections employed in large ESA designs.

Existing coaxial RF interconnect solutions rely on frequency-dependent coaxial connectors and cable assemblies, such as SMA, GPPO, SMK, and other connector types. "Ganged" RF connectors comprise coaxial connections that are grouped into common chassis or housings, and are often used to improve assembly efficiency. However, these still rely on coaxial cables with their inherent limitations noted above. High-speed high-density digital connectors are typically employed to carry low-power digital signaling comprising square wave (binary) or similar signaling waveforms on each contact, with these signals having a fundamental frequency and many harmonics which form the binary signal waveforms. Moreover, the impedance of high-speed high-density digital connectors is typically tuned for high-speed digital signaling, such as $85\Omega$. In contrast, the examples herein carry amplified and modulated RF signaling which typically use a $50\Omega$ characteristic impedance. Thus, the requirements for which the digital connectors are designed and intended are quite different from the RF signaling components and impedances discussed herein.

However, high-speed digital connectors can have configurations with several hundreds of contacts or pins, and thus the examples herein advantageously employ digital connectors for non-digital RF signaling. Also, RF signaling can be combined with digital signaling and power links in the same connectors. By supporting both vertical and right-angle RF interconnect, this approach enables multiple combinations of mechanical architectures for ESAs and other RF systems, including tiled, bookshelf, or both, to be used in a single ESA.

Typically, high frequency RF links require special handling to maintain signal integrity, power levels, low crosstalk, low reflections, phase relationships, and other properties. The frequency ranges which may apply herein include the L band through the Ka band, which might also include the X band, among others, which can apply to frequencies of 1 GHz to 31 GHz and above. The design and implementation of the active full-duplex ESA system requires sufficient Tx beam to Tx beam, Rx beam to Rx beam and Tx beam to Rx beam isolation to meet ESA transmit and receive performance targets or requirements. For standalone ESAs, typical beam to beam isolation targets are in excess of 45 dB while Tx beam to Rx beam isolation targets are dependent on transmitted EIRP, Tx to Rx frequency separation, physical separation and other spacecraft accommodations. Moreover, 90° bends are typically not achievable with coaxial cables without causing unwanted internal reflections or phase errors from such bends. Thus, the examples herein employ digital connectors for an unintended purpose of carrying high-frequency RF signals, with the option to provide 90° bends or straight connections, among others.

Moreover, the connectors discussed herein are typically printed circuit board (PCB) mounted connectors. This enables routing of RF signals using stripline (or microstrip) segments provided by such PCBs instead of coaxial cables. This can avoid the drawbacks of coaxial cables and coaxial connectors entirely, and provide for enhanced RF performance overall, especially in high-density designs employed for ESA systems. The use of PCB striplines also provides the advantage of customizing impedance matching for each RF link to a high precision. For example, impedance targets of $50\Omega$ links can be established using the digital connectors and stripline segments of the PCBs, with PCB layout, routing, and manufacturing techniques providing high-precision confidence in such impedance targets. In contrast, coaxial links are typically formed by cutting longer coaxial cables to a length, an inherently inaccurate process, not to mention application of connector ends, ensuring adequate shield connections to connectors, moisture ingress concerns, human error, machine tolerances, and other factors which may assembly of individual coaxial cables troublesome.

Turning first to a discussion on various enhanced full duplex modular RF antenna aperture architectures and designs, FIGS. 1-6 are presented. FIG. 1 illustrates view 100 as an isometric view of antenna array 110 comprising a lattice with square elements on a square grid. Antenna array 110 is formed from several assemblies, such as subarrays 120 that each include a set of antenna apertures and further associated structures. Also among the subassemblies are several assemblies, of which Level 1 (L1) RF assemblies 130 are visible in FIG. 1. Subarrays 120 each include several elements, including horn element 121 that establishes aperture 129, polarizer 122, transmit waveguide filter 123, receive waveguide filter 124, and subarray substructure 125. Subarrays 120 comprise modular subassemblies which can be assembled into antenna array 110, along with other elements discussed in the Figures below.

FIG. 1 presents an illustrative example featuring fifteen (15) subarrays 120, totaling 120 (12×10) aperture antenna elements. The various subarrays 120 of antenna array 110 are arrayed in a panel configuration to form a 5×3 array of subarrays each having an individual array of 4×2 (8) horn apertures, with provisioning for an additional three (3) sub-assemblies using associated spare connectors (135/136). While these 120 aperture antenna elements can be employed in a full duplex ESA configuration, other configurations and operations are possible. Example physical dimensions can vary by implementation, but one example grid spacing (approximate aperture width) includes 3.9 inches.

Subarrays 120, when assembled into antenna array 110, can be configured to carry RF transmit and receive signals concurrently in a full duplex state of operation. That is, both transmit (Tx) and receive (Rx) signals can propagate concurrently through each antenna aperture and are handled by corresponding feed elements and circuitry. Transmit and receive signaling will typically have opposite propagation direction, and thus examples herein that discuss Tx signal propagation can also apply to Rx signal propagation. As will be discussed herein, RF signals can be fed to antenna array 110 through coaxial inputs/outputs and then carried by stripline connections and high-density digital connectors to reach subarrays 120, with various beamforming and signal distribution elements incorporated therein. Thus, in some examples, once the input/output connections are made, no further coaxial links are employed within antenna array 110. For instance, FIG. 1 shows high-density digital connectors 135-136 on L1 RF assemblies 130, which can couple to instances of subarrays 120. High-density digital connectors can also be employed to couple RF signals among other assemblies and modules in antenna array 110.

Advantageously, these enhanced arrangements form a compact antenna array capable of independent X-band RF Tx and Rx capabilities within an 8-element subarray which is assembled, along with other 8-element subarrays, into antenna array 110. When compared with traditional individual or stand-alone subarrays (e.g., separate Tx/Rx), the examples herein can provide significant size, mass, and cost reduction, as well as eliminate all intra-array RF cable assemblies and associated RF (phase and amplifier) tuning requirements. The high-density configurations discussed herein can also reduce DC cable assemblies by over 70% and employ high-speed digital connectors for carrying microwave frequency RF signals, providing modular and pluggable interconnects in manufacturing environments. Additionally, when employed for ESA systems, the examples herein can provide four (4) geolocation beam outputs for emitter location purposes, leveraging monopulse techniques and narrow beam nulling through advanced beam optimization digital processing.

Figure 2:
FIG. 2 illustrates an antenna array assembly in an implementation.

FIG. 2 illustrates view 200 of antenna array 110, which shows an underside view compared to view 100. From this view, additional elements of antenna array 110 are visible, such as Level 2 (L2) assembly 210 and thermal conduit elements 230. Additional elements are shown for subarrays 120, such as circuit card assemblies (CCAs) 221 having connectors 222 and connectors which mate with connectors 135-136 of L1 RF assemblies 130. Six (6) instances of L1 RF assemblies 130 are included, each of which comprises CCA 131 that couples between CCA 211 of L2 RF assembly 210 and corresponding CCAs 221 of fifteen (15) subarrays 120. At subarrays 120, RF signals can be launched into waveguide structures from corresponding conductive circuit boards structures. The Tx signaling can be emitted by corresponding aperture antennas (e.g., horn apertures), and the Rx signaling can be received by the same aperture antennas. In one example, the radiated Tx beams correspond to LHCP and the receive Rx beams correspond to RHCP, although variations are possible.

As seen in view 200, each subarray 120 can couple to corresponding thermal conduit elements 230 which also can act as structural cross-members. L1 RF assemblies 130 can couple via brackets 132 to thermal conduit elements 230. Thus, thermal conduit elements 230 form a substructure or frame onto which other elements of antenna array 110 can be mounted. Moreover, thermal conduit elements 230 transport thermal energy for antenna array 110, such as to conduct thermal energy generated by elements of antenna array 110 to radiator elements. Radiator elements can radiate thermal energy into the local environment or space, depending on the application and deployment.

ESAs and accompanying communication systems can dissipate a significant portion of their input electrical power as heat, and can require controlled operating temperatures to provide the desired performance and reliability. Heat generated during operation, especially in space environments, can cause thermal problems for ESAs and other satellite components, and so thermal radiators can be employed to radiate at least a portion of the heat into space. The use of direct-radiating, earth-facing ESAs can expose temperature-sensitive transmit/receive components to constant direct sun illumination, especially when deployed to a Geosynchronous Orbit (GEO). Heat pipe networks can be included that transport heat generated by components to thermal radiator features. Thermal conduit elements 230 comprise a portion of such a heat pipe network, with heat pipes at least partially embedded antenna array 110 that are configured to accept thermal energy from various electrical/RF components and transport the thermal energy to radiator panels. Thermal conduit elements 230 are positioned proximate to subarrays 120 and between subarrays 120 and L1 RF assemblies 130, such that at least amplifier elements of subarrays 120 can transfer thermal energy to thermal conduit elements 230.

The thermal network associated with thermal conduit elements 230 is configured to regulate temperatures of associated components to a selected temperature or temperature range. Thermal conduit elements 230 might represent a portion of a satellite or other device that is thermally incongruent or regulated to a different temperature from other components on a satellite, such as propulsion, communication routing circuitry, sensors, or other payloads.

Thermal conduit elements 230, such as heat pipes, form conduits that use a working fluid in thermal contact with electrical/RF/waveguide components to transport thermal energy away from these components. The heat pipes can be embedded in a honeycomb structure for heat conduction and transfer, as well as structural support and rigidity. The heat dissipated is absorbed by the working fluid through walls of the heat pipes which causes a phase change in the working fluid, such as from a liquid phase to a gas/vapor phase. The vapor transports the thermal energy along the length of the heat pipes to a relatively cold portion of the heat pipes and then condenses back into the liquid phase, which releases latent heat. This transported thermal energy can be emitted or otherwise radiated by radiator panels or cooled with active cooling devices. The liquid can then be returned to the portion of the heat pipes proximate to the hot components to repeat the cycle. The liquid can be returned using various techniques, such as capillary action, centrifugal force, pumping systems, or other processes.

L1 RF assemblies 130 comprise CCAs 131, mounting brackets 132, connectors 133, and connectors 135-136. CCAs 131 include circuitry to handle beamforming activities for individual subarrays 120. CCAs 131 can receive Tx RF signaling over connectors 535 and route the Tx signaling to various transmit beamforming circuitry, filters, amplifiers, signal conditioners, splitters, multiplexers, modulators, demodulators, or array control systems for an associated subarray. Likewise, CCAs 131 can receive Rx RF signaling from waveguide components of an associated subarray and route this Rx RF signaling to various beamforming circuitry, filters, amplifiers, signal conditioners, splitters, multiplexers, modulators, demodulators, or array control systems, and then over connectors 536. CCAs 131 also can receive beamforming control signaling, other control signaling, power, and provide status signaling over connectors 222.

L2 assembly 210 comprises CCA 211 RF coaxial connectors 212-213, connectors 214-215, and connectors 216-217. RF coaxial connectors 212-213 can be segregated by Tx and Rx signaling, such as connectors 212 dedicated to Tx signaling and connectors 213 dedicated to Rx signaling. Furthermore, a portion of coaxial connectors 212-213 can correspond to test RF signaling or other connections. RF coaxial connectors 212-213 can comprise various push-fit, bayonet, or screw-on coaxial connectors, including SMA, GPPO, SMK, and other connector types. Typically, sixteen (16) coaxial connectors will correspond to Tx signaling and a further 16 coaxial connectors will correspond to Rx signaling. Thus, antenna array 110 can provide independent and simultaneous operation of up to 16 Tx and 16 Rx simultaneous, independent, shapeable, and steerable beams. Once RF signals are coupled to CCA 211 by coaxial connectors 212-213, further conductive transport of RF signals can be handled by stripline (or microstrip) connections of the corresponding CCAs, as well as inter-CCA connections made over high-density digital connectors. Similar to CCAs 131, Tx and Rx signaling can be segregated on a per-side or per-layer basis for CCA 211. This can provide additional isolation among Tx and Rx signaling.

L2 RF assembly 210 comprises an RF and digital assembly comprising one or more CCAs, such as CCA 211, for RF and digital functions. External command and control and power connections can be provided through connectors 214. CCA 211 receives these external command and control signals, processes them, and can then control each discrete subarray 120 through corresponding connectors on the underside (hidden from view). In some examples, more than one L2 CCA is employed, and CCA 211 handles digital signaling and processing. This digital CCA can also control components on an RF CCA through an associated cable harness. This multi-CCA arrangement provides a single command and control interface for the ESA in changing subarray beam parameters. as well as can provide some isolation among digital signaling and RF signaling on separate CCAs. In such cases, RF coaxial connectors 212-213 might couple to traces which pass-through the RF signals from the digital CCA to corresponding RF CCAs.

CCA 211 includes circuitry to signal distribution and beamforming activities with respect to CCAs 131. CCA 211 can receive Tx RF signaling over associated coaxial connectors and route the Tx signaling to various transmit distribution circuitry, beamforming circuitry, filters, amplifiers, signal conditioners, splitters, multiplexers, modulators, demodulators, or array control systems. CCA 211 transfers the Tx signaling over connectors 215 to corresponding CCAs 131. Likewise, CCA 211 can receive Rx RF signaling over connectors 216 from individual CCAs 131 and route this Rx RF signaling to various distribution circuitry, beamforming circuitry, filters, amplifiers, signal conditioners, splitters, multiplexers, modulators, demodulators, or array control systems, and then over coaxial connectors.

CCAs 211, 131, and 221 comprise printed circuit boards formed from a substrate material and layers of conductive/routing materials which route various control signaling and RF signaling. RF signaling can be carried by stripline links, which can have Tx and Rx signaling segregated among different sides or layers of corresponding PCBs. For example, a first side of a PCB can be dedicated to routing only Tx RF signaling and a second side of a PCB can be dedicated to routing only Rx RF signaling. Internal layers and surface layers might be employed for a 'side' of Tx or Rx signal routing, which can be separated using one or more ground (or power) conductive planes. Thus, a circuit card assembly comprising a printed circuit board can be configured to segregate receive radio frequency signaling from transmit radio frequency signaling by at least having a first side comprising circuitry and routes corresponding to the receive radio frequency signaling a second side comprising circuitry and routes corresponding to the transmit radio frequency signaling. The receive radio frequency signaling and the transmit radio frequency signaling can be routed to an input/output multi-connection non-coaxial connector (e.g., high-density high-speed digital connector) 222 mounted on a side of the printed circuit board opposite of coaxial connectors coupled into the amplifier-filter module.

Pathlength matching can also be included among signal lines on the various circuit boards and through associated connectors such that lengths among Tx signals and lengths are matched and lengths among Rx signals are matched. This matching can reduce amplitude and phase errors among signals within a particular beam, and reduce channel-to-channel or path-to-path group delays to be less than approximately one nanosecond over a selected frequency range.

Moreover, various via fencing and other techniques can be provided for stripline shielding and isolation. Other layers of the PCBs can be employed for routing various digital control signaling, status signaling, power links, digital communication interface signaling, or other signaling, which may include routing on layers with RF signaling. Furthermore, various power and control circuitry can be included on the CCAs, such as logic circuitry, beamforming circuitry, beamforming integrated circuits (BFICs), FPGAs, processors, connectors, passive components (resistors, capacitors, inductors), test points, status indicators, amplifier circuitry, analog-to-digital or digital-to-analog circuitry, power conversion, conditioning, and distribution circuitry, and other various circuitry.

FIG. 2 also shows a structural relationship between circuit boards employed for L2 assembly 210, L1 RF assemblies 130, subarrays 120, and associated high-speed high-density digital connectors or connector assemblies. In this example, three CCAs 221 of subarrays 120 are coupled to a corresponding CCA 131 of L1 RF assemblies 130 at right-angles (perpendicularly) such that six (6) L1 CCAs 131 are employed. Finally, these L1 CCAs 131 couple to one L2 CCA 211 with right-angle connectors. L2 CCA 211 couples to the six (6) L1 CCAs 131 and provides connections to the input/output coaxial links 215/216.

A rigid inter-board coupling is achieved without the use of coaxial links/cables/connectors. Straight or right-angle connections can be made between circuit boards using the high-speed high-density digital connectors. A series of stripline or microstrip RF links are formed between coaxial input/output links 212-213 and subarrays 120, which includes several multi-connection non-coaxial connectors. CCAs 221 of subarrays 120 can then route the RF signals to associated RF radiative components, such as waveguides and apertures, which interface using various waveguide-compatible interfaces.

As mentioned, each CCA comprises a printed circuit board (PCB) that includes stripline style of signal routing for RF signal links. The striplines can include matching networks with striplines and stripline properties (e.g., conductor thickness, width, spacing, and transitions thereof). PCBs can also have via structures or via fences which follow and surround the routing of individual striplines or sets of striplines such that isolation and crosstalk can be reduced. PCBs carry signals between high-density high-speed digital connectors and house these connectors. The PCBs are also used for combining, splitting, fan-out, beamforming, beam shaping when associated components are included on the PCBs. Thus, coaxial links are entirely avoided after links 212-213 in antenna assembly 110.

In addition to RF signaling, other signaling and connections can be provided over connectors 214-215 of L2 assembly 210 and connectors 222 of CCAs 221, among other connectors. This signaling can include signaling for control, status, beamforming control, power, grounding, digital signaling, command and control communication interfaces, testing, calibration, and other signaling. While the examples herein focus on RF signaling, it should be understood that various other connections and signaling can accompany the RF signaling on different or similar connectors throughout antenna array 110.

L2 assembly 210 and L1 RF assemblies 130 form a tiered configuration which has a first layer (L1) comprising six (6) L1 RF assemblies 130 corresponding to RF DB (distribution/combiner) pair modules and second layer (L2) comprising L2 assembly 210 corresponding to an RF and DCB (digital control board/network) module. Having such a L1/L2 configuration can reduce integration complexity and manufacturing time, as well as provide for the modular, compact full duplex arrangement. This arrangement also provides flexibility in changing the subarray beam parameters while maintaining primary payload processor interfaces (e.g. Space Wire (SpW) and/or LVDS) at the array level. The L1/L2 RF architecture also includes separate high-density digital connectors for Tx and Rx signaling, which can provide greater than 60 dB isolation and can eliminate lower signal level Tx-Rx beam level coupling. When deployed onto satellites or spacecraft, combining Tx and Rx functions into each subarray 120 with the L1/L2 beamforming network arrangement can reduces total array footprint by 50% on NADIR panels (i.e., earth-facing) and mass>35%.

Figure 3:
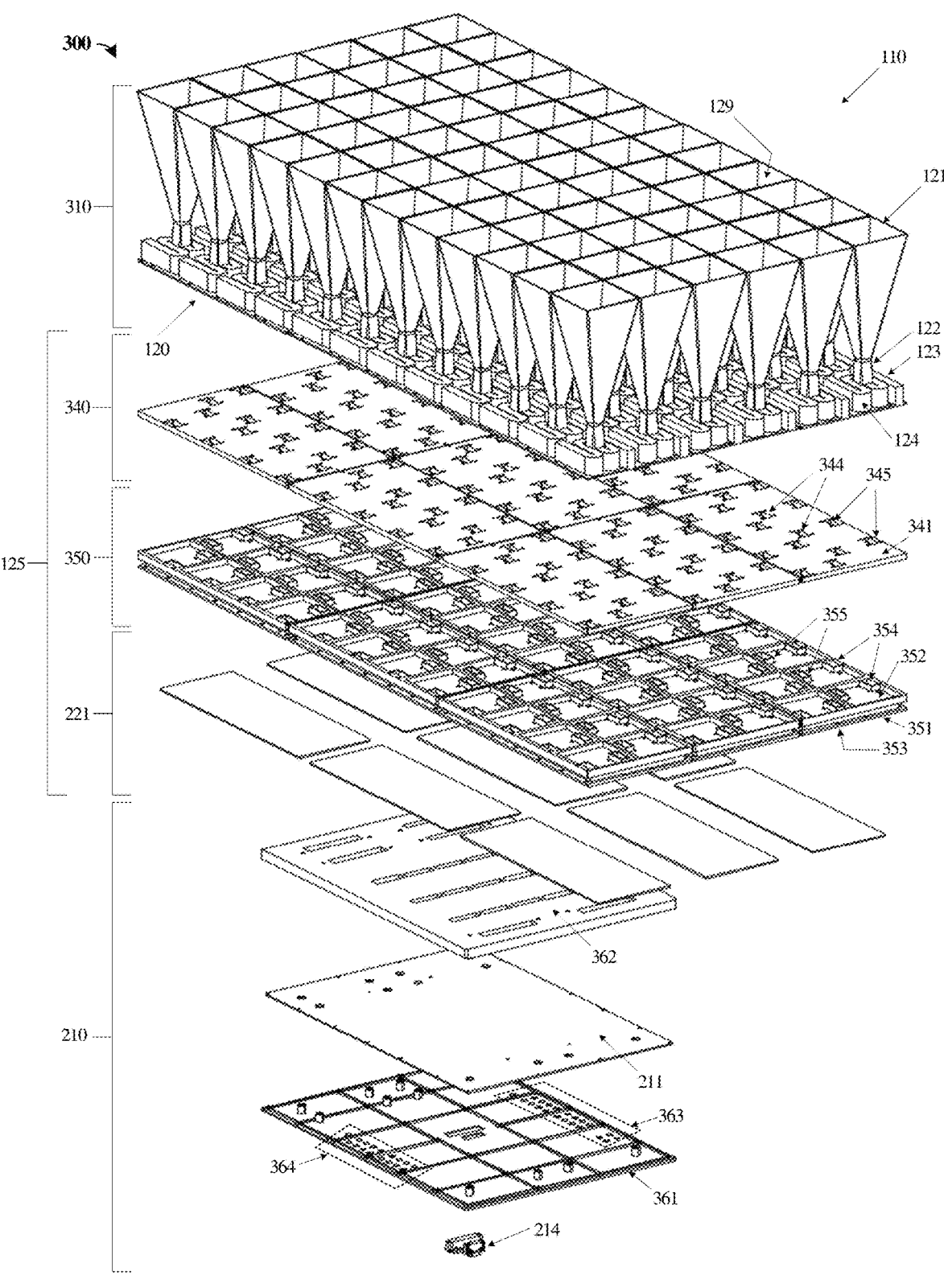
FIG. 3 illustrates an exploded view of an antenna array assembly in an implementation.

FIG. 3 is now presented as an exploded view of a portion of antenna array 110. View 300 includes several sections, with L1 RF assemblies 130 omitted for clarity in viewing of other portions of antenna array 110. View 300 includes aperture assembly section 310, subarray substructure 125, and L2 assembly 210. Aperture assembly section 310 includes apertures 129 formed by horn elements 121, polarizers 122, transmit filters 123, and receive filters 124. Subarray substructure 125 includes waveguide adapter plates 340, amplifier-filter modules 350, and CCAs 221. Waveguide adapter plates 340 each include several short waveguides (Tx ports 344 and Rx ports 345) through which RF energy can propagate to/from filters 123-124. Amplifier-filter modules 350 each include Tx ports 354 and Rx ports 355 through which RF energy can be introduced into Tx cavities 352 and Rx cavities 353 and amplified and/or filtered. RF signals are coupled to/from Tx cavities 352 and Rx cavities 353 over coaxial links mounted to CCAs 221 which are coupled to stripline links of CCAs 221. Tx cavities 352 and Rx cavities 353 can house which RF amplifier and filter elements. L2 assembly includes chassis portion 362, CCA 211, chassis portion 361, and control interface connectors 214-215. Chassis portion 361 includes various holes through which connectors of CCA 211 can penetrate to couple to external links, such as holes 363-364 for coaxial RF connectors and associated holes for connectors 214-215.

Figure 4:
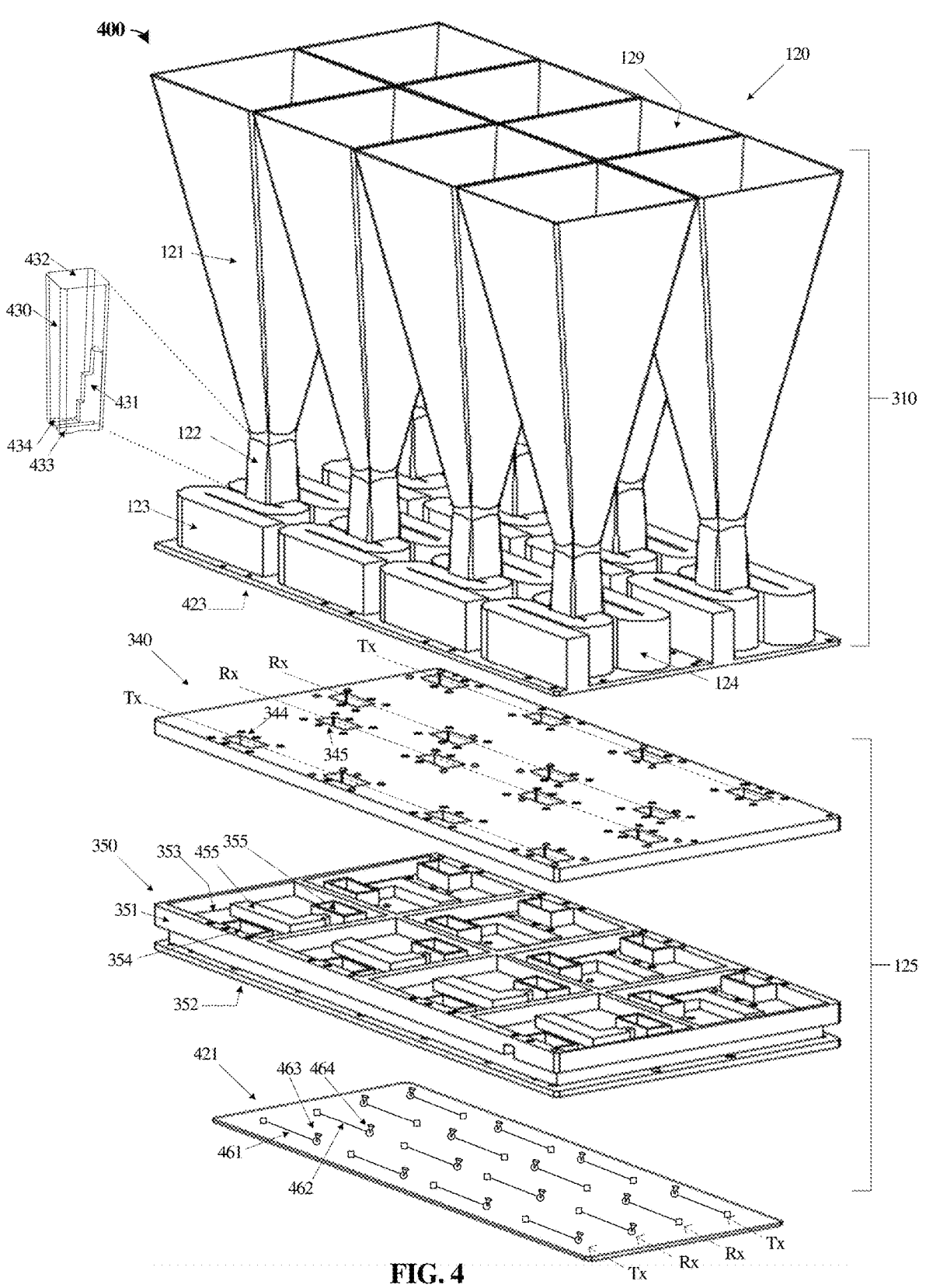
FIG. 4 illustrates an exploded view of an antenna subarray in an implementation.

FIG. 4 illustrates exploded view 400 of one subarray unit, which corresponds to any among subarrays 120 mentioned above, although variations are possible. Subarray 120 includes aperture assembly section 310 and subarray substructure 125 includes waveguide adapter plate 340, amplifier-filter module 350, and CCA 221. These various layers or substructures are pressed/fit together during manufacturing into an assembled body, which can be held together by various fasteners, welds, latches, adhesives, friction joints, or other techniques, and include one or more gaskets between certain layers to ensure proper fitment, reduce RF leakage, minimize discontinuities, reduce cross-talk and interference, or reduce passive intermodulation (PIM), as well as include RF-transparent foams or filler materials reduce multipaction arising in vacuum environments.

Subarray 120 includes aperture assembly section 310 which includes apertures 129 formed by horn elements 121, and also includes polarizers 122, transmit waveguide filters 123, and receive waveguide filters 124. Subarray 120 comprises a modular portion of an antenna assembly and provides full duplex beamformed operation of concurrent transmit and receive of radio frequency signals, with polarizer 122 establishing transmit ports having a first circular polarization and receive ports establishing a second circular polarization orthogonal to the first circular polarization.

Figure 5:
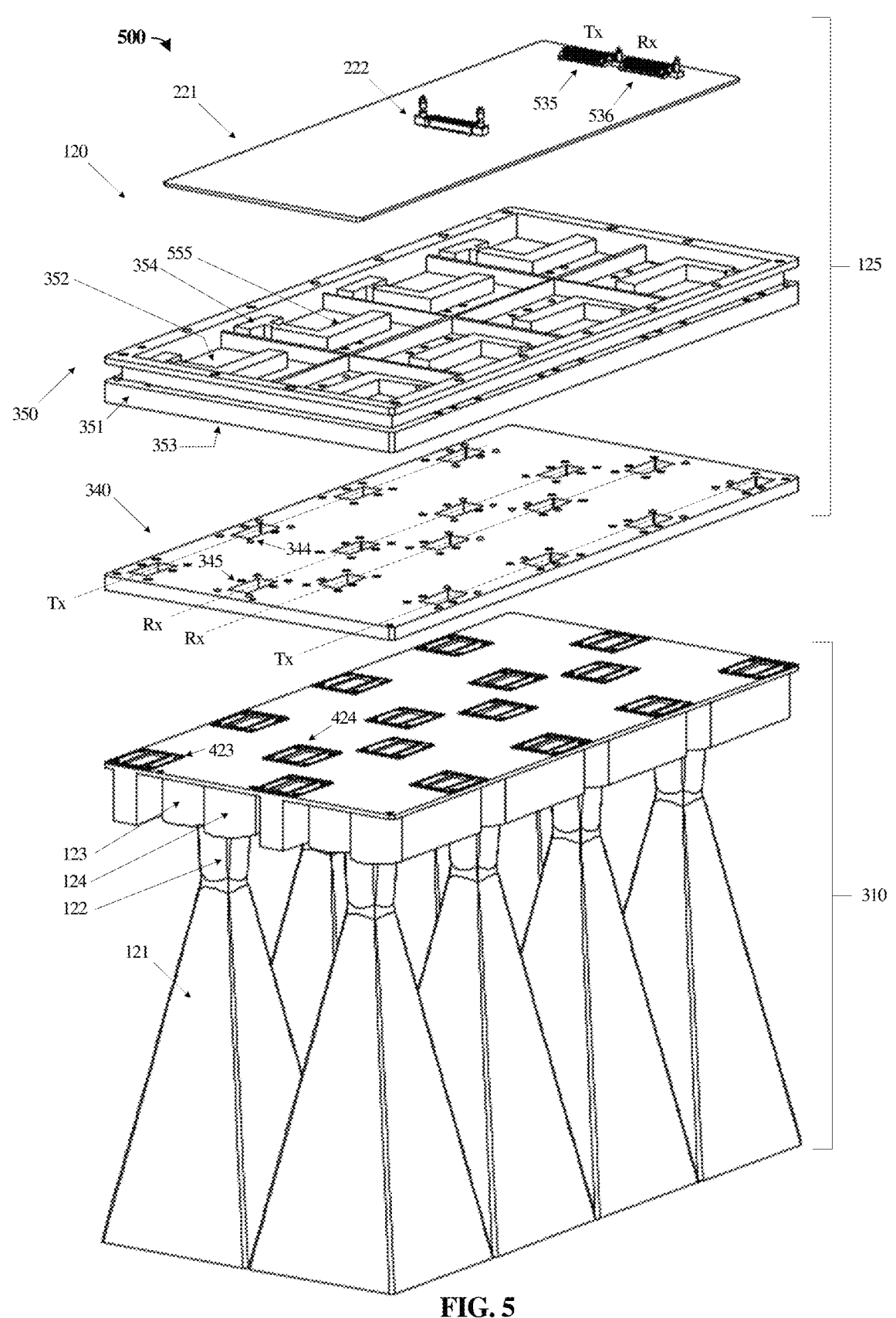
FIG. 5 illustrates an exploded view of an antenna subarray in an implementation.

Horn elements 121 can vary in shape from that shown in FIGS. 1-3, such as that shown in FIGS. 4-5. Variations in horn/aperture shape can still provide full duplex operation over a similar frequency range as horn elements 121 in FIGS. 1-3, and provide relative manufacturability or cost advantages based on the selected manufacturing technique. Polarizers 122 can include septum styles of waveguide polarizers which can have longitudinal stepped septum features that selectively split power among Tx/Rx ports and propagate RF energy between the Tx/Rs ports and a shared/common port while establishing a polarization (LH or RH) for the Tx/Rs ports. In one example, polarizer 122 generates circular polarization (CP) by shifting phases (q) of the Tx/Rs signals by a corresponding±90°. Polarizer 430 shows one example implementation of polarizer 122 as a stepped septum polarizer. Specifically, polarizer 430 can establish a first polarization for Tx signals which is selectively propagated by transmit port 433 to shared port 432 of polarizer 430 (coupled to horn element 121). Rx signals can be received by horn element 121 and propagate to shared port 432 on polarizer 430, polarizer 430 can establish a second polarization for Rx signals, and then selectively propagate the Rx to receive port 434 on of polarizer 430. Thus, polarizer 430 can selectively propagate Tx and Rx signals based on a polarization of the signals established by the septum. In other examples, polarizer 430 can comprise an orthomode transducer (OMT), polarization duplexer, or have other configurations.

From here, filters 123-124 are included. Filters 123-124 can comprise waveguide resonant cavities providing band-pass types of filters, such as iris filters, which may include cross-coupling or stubs to introduce propagation zeroes, among other configurations. On transmit, Tx signals are introduced to a Tx input port 423 of transmit filter 123, filtered according to the filter properties of transmit filter 123, and then propagated to a Tx output port of transmit filter 123 to a Tx port of polarizer 122 and horn element 121. On receive, Rx signals are introduced to an Rx input port of receive filter 124 from an Rx port of polarizer 122, filtered according to the filter properties of receive filter 124, and then propagated to an Rx output port 424 of receive filter 124.

Tx input ports 423 and Rx output ports 424 of filters 123-124 couple through short waveguides formed into waveguide adapter plates 340, labeled as elements 344-345. Waveguide adapter plate 340 adapts Tx input ports 423 and Rx output ports 424 to corresponding ports 354-355 on amplifier-filter module 350. Adapter plates 340 provide body 341 having short sections of waveguide which can be employed to transition among different port diameters/cross-sectional configurations, or can instead provide for length matching between amplifier-filter module 350 and filters 123-124. This waveguide section can provide for decoupling among ports and provide selected waveguide lengths to avoid trapped or degenerative modes between the aperture filter and amplifier-filter module. These trapped modes can cause negative spikes in out-of-band rejection.

Amplifier-filter module 350 provides side-segregated handling of Tx and Rx signals, such that a first side houses Rx cavities 353 (facing waveguide adapter plates 340) and a second side houses Tx cavities 352 (facing CCAs 221). Amplifier-filter module 350 comprises body 351 forming conductive shielding into which the various cavities can be formed and into which various RF components can be housed. For Tx signals, amplifier-filter module 350 can include amplifier and filter elements, which might comprise RF power amplifiers and comb filters to amplify and condition Tx signals before propagation into further downstream elements at ports 354. Rx signals are coupled from ports 424 to ports 355 of amplifier-filter module 350 through adapter plate waveguides 345. Amplifier-filter module 350 can include Rx amplifier and filter elements, which might comprise low-noise amplifiers (LNAs) and comb filter 455 to amplify and condition Rx signals before propagation onto a coaxial link-to-stripline adapter that feeds into upstream elements at corresponding CCAs. Side-segregated and iso- lated cavities 352-353 are included to house these various Tx and Rx amplifier and filter elements from each other and from among each beam/pathway. Thus, amplifier-filter mod- ule 350 can comprise body 351 having a first side compris- ing receive cavities 353 corresponding to the receive radio frequency signaling a second side comprising transmit cavi- ties 352 corresponding to the transmit radio frequency signaling. Coaxial connectors (463-464) mounted to circuit card assembly 221 can penetrate a shielding or body of corresponding cavities to transport the receive radio fre- quency signaling and the transmit radio frequency signaling to the amplifier elements or the filter elements in the corresponding cavities.

Through waveguide adapter plates 340, amplifier-filter module 350, filters 123-124, polarizers 122, and horn ele- ments 121, RF signals propagate in an RF radiative wave- guide-like manner, such as in various transverse electromag- netic propagation modes supported by the geometries of the waveguides which are air-filled or vacuum-filled cavities. However, at CCA 221 (and further CCAs in antenna array 110), stripline RF conductive type of RF propagation is employed. The striplines of CCA 221 further couple to amplifier-filter module 350 using stripline-to-coaxial con- nections for Tx signals (and vice versa for Rx signals). Then, various coaxial launch or receive elements are included at amplifier-filter module 350 which convert RF signals among a conductive style of RF propagation and a radiative or waveguide style of RF propagation. RF launch probes or other elements can be included. Launch probes can fit into ports or cavities established in amplifier-filter module 350. Launch probes can comprise conductive coaxial style of connectors and protrusions which emit (or receive) RF signals from associated stripline conductors into associated waveguides. Thus, launch probes can couple among stripline conductive links and coaxial conductive links which then interface with radiative portions of subarrays 120.

Various coaxial connectors and structures can couple through walls of waveguides or cavities of amplifier-filter module 350, such as surface mount coaxial connectors mentioned herein, coaxial bullets, and radiative probes. Hermetic feed-through (i.e., glass sealed) components can be employed to interface between conductive and radiative portions of subarrays 120. Example striplines 461 (Tx) and 462 (Rx) are shown coupled to SMT coaxial connectors 463 (Tx) and 464 (Rx). Although variations are possible, in FIG. 4, coaxial cables are not employed, and instead direct stripline-to-coaxial connections are established using sur- face-mount coaxial connectors.

FIG. 5 illustrates exploded view 500 of one subarray unit, which corresponds to any among subarrays 120 mentioned above, although variations are possible. FIG. 5 shows a reverse angle view with respect to FIG. 4, and thus different elements are visible. For example, Tx ports 423 and Rx ports 424 are visible on an underside of aperture assembly section 310 which feed corresponding filters 123-124. Moreover, connectors 535-536 are visible which couple RF signals for subarray 120 over high-speed high-density digital type of connectors to stripline conductors on CCA 221. Connector 222 is also visible, which is discussed above.

Aperture assembly section 310 can be formed from mono- lithic workpieces or formed into a single monolithic piece of material to establish eight (8) horn assemblies per subarray 120, comprising eight instances each of a horn (1), polarizer (1), filters (2), and corresponding ports. In some examples, each horn aperture is formed as a separate monolithic subassembly comprising a horn (1), polarizer (1), filters (2), and ports, with eight (8) such horn assemblies are employed per subarray 120. In other examples, more than one instance of horn, polarizer, filters, and ports can be formed into a multi-aperture monolithic set of 2, 4, or 8 instances. Aper- ture assembly section 310, or subassemblies thereof, can be formed using an additive manufacturing (AM) technique, also referred to as 3D printing. AM techniques can include various manufacturing processes suitable for metal or metal alloy materials such as Direct Metal Laser Sintering (DMLS), stereolithography (SLA), selective laser sintering (SLS), among others. Other examples include polymer or non-conductive material 3D printing which then have RF- contacting surfaces coated, plated, or deposited with layers of conductive material. Thus, while the specific AM tech- niques employed can vary, the enhanced waveguide and aperture structures discussed herein can provide desired performance over selected frequency ranges. Materials selected for aperture assembly section 310 include various conductive materials, such as metals, metal alloys, alumi- num, copper, nickel, magnesium, steel, or other materials, including alloys thereof. In other examples, a non-conduc- tive or polymer material can be employed, with surface coatings, platings, or treatments used to apply a conductive layer onto RF-contacting surfaces. Thus, aperture assembly section 310 can have internal/external surfaces which are conductive for RF energy propagated through corresponding waveguide cavities.

Advantageously, this 3D printed configuration of a por- tion of subarray 120 that includes the horn, polarizer, waveguide filters, and ports can significantly reduce subar- ray and antenna array assembly, integration and test (AI&T). The 3D printed structure also can provide a monolithic, continuous waveguide and subarray assembly structure to reduce PIM risk by eliminating joints and discontinuities to reduce PIM sources that otherwise may degrade antenna gain-to-noise-temperature (G/T) and interfere with other co-site receivers. The monolithic design can include one or more sets of horn apertures, polarizers, and filters, among other waveguide components.

Portions of amplifier-filter module 350 and waveguide adapter plate 340 can be formed using 3D techniques and materials discussed for aperture assembly section 310, or instead may be formed using machining, casting, injection molding, or other techniques suitable for the material and desired performance characteristics. Further examples of aperture assembly section 310, waveguide adapter plate 340, and amplifier-filter module 350 include use of single or similar materials with single or similar surface platings. This configuration can include silver plated aluminum per ASTM B700, among other materials, with anti-tarnish coatings and surface Roughness approximately <16 micro inches in some examples. Matching materials and material hardness across interfaces can reduce leakage from thermal gradients, main- tain low PIM over operational conditions, and reduce gal- vanic effects by avoiding dissimilar metals.

CCA 221 can include independent transmit and receive beamforming integrated circuits (BFICs), receive time delay unit (TDU) components, and programmable logic devices (i.e., field programmable gate arrays (FPGAs)) for indepen- dent transmit and receive digital command and control over Serial Peripheral Interface (SPI) buses, among other com- munication interfaces for beamforming command, control, and configuration. This arrangement for subarray 120 discussed above can provide sufficient transmit to receive path isolation which eliminates or significantly reduces receiver degradation and increases performance of simultaneous Tx/Rx communication. The full duplex (FD) architecture can significantly minimize phase and amplitude errors through elimination of 100% intra-array RF coaxial cable assemblies. This can be achieved by the use of high tolerance stripline matching and parts placement including RF connectors and high-speed high-density digital inter-CCA connectors. Further examples of CCAs and inter-CCA connections are discussed in FIGS. 6-9.

Figure 6:
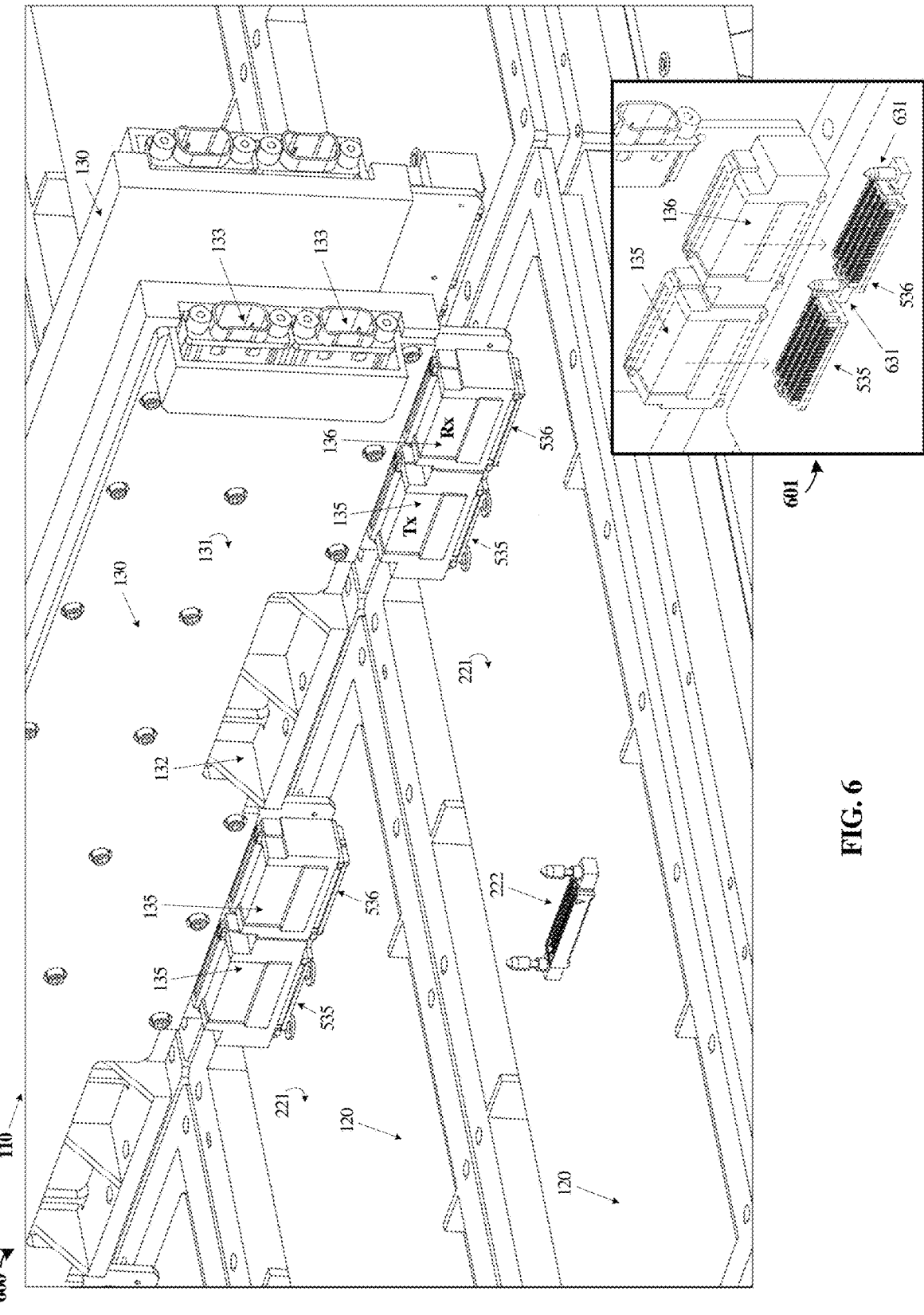
FIG. 6 illustrates antenna subassembly interconnections in an implementation.

FIG. 6 includes a detailed view 600 of a portion of antenna assembly 110 which includes several CCAs populated with components. View 600 shows CCAs 120 and 130 which are coupled by high-density connectors 135-136 and 535-536. Detailed inset view 601 shows an example of an un-mated connector arrangement, although variations are possible. During assembly, connectors 135-136 and 535-536 are brought into proximity and alignment pins 631 align connectors 135-136 and 535-536 along two axes for mutual insertion and mating. Connectors 135-136 and 535-536 typically include opposing main portions that mate with each other, often referred to as a male connector and female connector (or socket).

Horn apertures are hidden from view below the stackup of the various CCAs, along with various waveguide-based RF components (e.g., polarizers, filters, etc.), and are used to transmit and receive radiated RF signaling from distant nodes. Various chassis elements and structures can be included to mount the CCAs and RF components, as well as provide rigidity for deployment into various environments. Among these are brackets 132 which can mount L1 RF assemblies 130 to a corresponding thermal rail.

As can be seen in FIG. 6, CCA 221 is in a generally horizontal configuration from which several horn apertures are fed. CCA 221 couples perpendicularly to CCA 131 via connectors 135-136 and 535-536, which comprise right-angle or 90° connectors with respect to CCA 131 in this example. CCA 131 mates with several other CCAs similar to CCA 221. Thus, CCA 131 provides fan-out or beamforming of signal routing from several CCAs 221, and can be referred to as a signal combiner. As will be seen in the remaining Figures, CCA 211 is provided which acts as a signal combiner for several CCAs 131.

In this example, connector assembly 135/535 carries transmit (Tx) signaling and connector assembly 136/536 carries receive (Rx) signaling, thus segregating Tx signaling from Rx signaling on different connector pairs. The converse is also possible, with connector 135/535 carrying Rx signaling and connector assembly 136/536 carrying Tx signaling. This segregation of Tx from Rx signaling provides for high isolation among Tx/Rx signals, which can reach 80 decibels (dB) or more. In addition, signal isolation among individual connections or contacts carrying Tx/Rx signaling within a connector assembly by enhanced selection of which contacts/pins carry such signaling. These examples are discussed in FIG. 8 below, and can achieve 50 dB of isolation or more. The architecture or topology of the connector assemblies and CCAs provides for "full duplex" or concurrent Tx/Rx operation from a shared ESA and set of horn apertures. In contrast, typical ESA designs with coaxial connections have entirely separate ESA arrays for Tx and Rx operations, leading to larger and more complex assemblies.

Example "high-speed high-density" digital connectors employed for connectors 135, 136, 535, 536, 216, and 217 (and connectors 735, and 736 in FIG. 7) include various high-speed high-density open-pin-field array press-fit sockets and mating connectors, such as used in digital electronics and computing equipment for digital interface board to board and mezzanine connections carrying Ethernet, PCI Express, Fibre Channel, or InfiniBand signaling. These connectors include multi-connection non-coaxial types of connectors. Various connector interlocking can be included, such as press-fit types of connectors, although movable locking mechanisms might be included in some examples. For instance, Samtec® SEARAY™ high-speed right-angled (or straight) open-pin-field array connectors might be employed (SEAF or SEAM type connectors), which may include surface mount configurations.

Material selection for the connector bodies and pin/socket elements can be selected for the environment into which the antenna system is employed. For example, space-based applications and environments can have materials selected for the associated temperature ranges and off-gassing requirements. Additionally, dielectric materials and pin-spacing requirements can be selected for desired pin-to-pin isolation and impedance targets, for example having pin spacing (pitch) of 0.050 inches and a characteristic impedance of 85 Ω. This connector characteristic impedance of 850Ω might be coupled to 505Ω striplines of a CCA/PCB, and impedance matching networks can be employed to/from connectors for striplines that couple through/over any such connectors, such as using various passive impedance matching components. Also, it should be noted that the term pin, as used herein, may refer to actual pins or may instead refer to connector 'contacts' of various types.

Figure 7:
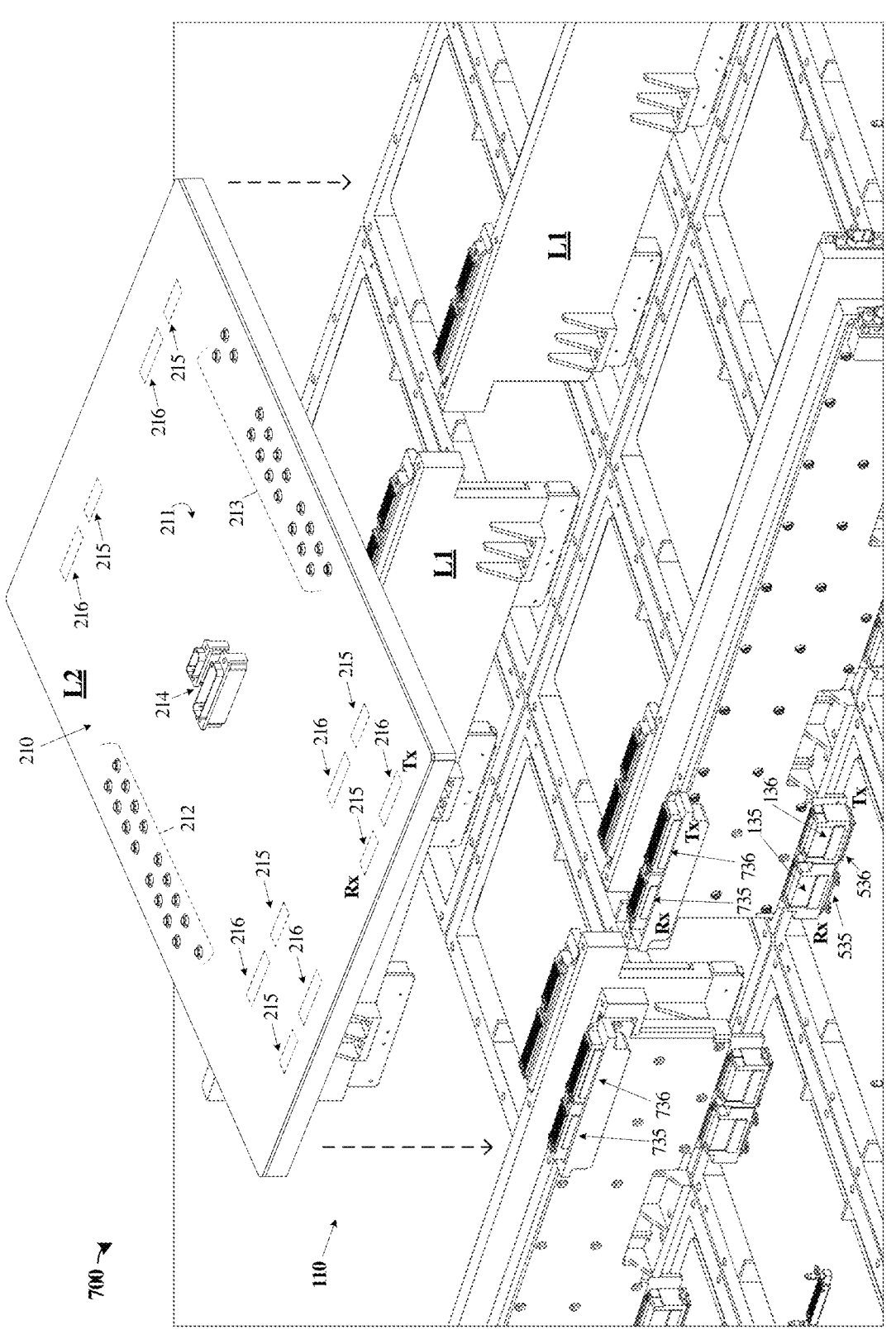
FIG. 7 illustrates antenna subassembly interconnections in an implementation.

FIG. 7 shows additional view 700 of antenna assembly 110 which shows L1/L2 interconnection including connector mating among connectors 215-216 on L2 assembly 210 and connectors 735-736 on L1 RF assemblies 130. In FIG. 7, L2 assembly 210 has not yet been connected to the various L1 RF assemblies 130. Assembly is provided by connecting the corresponding inter-board connectors (215-216 and 735-736) instead of making individual or ganged coaxial connections. Input/output of RF signaling for antenna assembly 110 can be provided by coaxial connectors 212-213 on CCA 211, however, further interconnection of RF signaling is provided by high-density high-speed digital connectors. Moreover, stripline connections are formed among coaxial connectors 212-213 on CCA 211 through the various layers or stackup of the associated printed circuit board, and these stripline connections are routed to associated connectors 215-216. L2 assembly 210 provides an initial fan out or beam signal formation from input/output coaxial connectors 212-213. From here, the RF signals are routed as stripline links from connectors 215-216 to mating connectors 735-736 on associated L1 RF assemblies 130. Finally, L1 RF assemblies 130 route these RF signals as stripline links over connectors 135-136 and 535-536 to CCAs 221 and underlying RF radiative components for transmit (Tx), or conversely from receive (Rx).

Tx and Rx signaling can be segregated among individual connectors or connector segments as shown in the Figures here, although variations are possible. For example, FIG. 7 shows connector 215 carrying Rx signaling and connector 216 carrying Tx signaling. Further segregation of Tx/Rx signaling can be maintained for each inter-board connector (e.g., Tx signaling over connectors 216, 736, 136, 536, and Rx signaling over connectors 215, 735, 135, 535) between L2 assembly 210 to CCAs 221 of subarrays 120. Advantageously, this configuration can lead to isolation of approximately 80 dB among Tx/Rx signaling for an ESA, and can enable concurrent usage of the same ESA panel for Tx and Rx signaling, further reducing size, weight, and cost of satellites or other vehicles.

Figure 8:
FIG. 8 illustrates example antenna subassembly interconnect pinouts in an implementation.

FIG. 8 illustrates tables 800-801 representing example pinouts for connectors employed herein. This example pinouts correspond to a connector with two connector bodies or sections, each section having sets of 20×10 connections, or 200 pins. Thus, a full connector can have 400 pins, with half dedicated to Tx signaling and half dedicated to Rx signaling. In this example pinout, a section of the connector is dedicated to RF signaling, namely columns A through H. An outer perimeter of pins within this RF signaling section of the connector is established to surround a set of thirteen (13) analog or RF signals, which correspond to numbered transmit (Tx) signals or receive (Rx) signals in this configuration. Thus, column A, column H, row 1, and row 20 are analog/RF ground (AGND) pins. Additional AGND pins are distributed throughout the RF signaling section to space apart individual RF pins from each other. This configuration can advantageously form a type of shield or conductive barrier around the RF pins as a group as well as individually.

Spacing and placement of pins that carry RF signals can be determined based on desired levels of signal isolation and reduction of crosstalk among RF pins. This can be determined by simulation or testing for the frequency ranges desired for the RF signals, among other techniques. For example, the spacing might be measured by a pin pitch, such as 0.5 or 0.8 millimeters (mm). For this pin pitch, and for frequency ranges corresponding to X band frequencies, a 50 decibel (dB) or greater isolation can be achieved RF pin to RF pin. Other factors in spacing include tracking errors among pins which correspond to how tight of tolerances the connector has for pin-to-pin spacing due to a manufacturing process and associated manufacturing tolerances.

In addition to RF signaling noted above, the same connector can carry other signaling which is routed to downstream circuit boards. In FIG. 6, this signaling includes digital signaling, such as digital ground (DGND) and DC power (TX_PWR, TX_RTN, RX_PWR, and RX_RTN). However, digital communication signaling can also be included, such as digital interconnect, single-ended or differential pair signaling, digital bus signaling, digital control signaling, status signaling, packet communications, Ethernet signaling, or other various signaling.

Advantageously, isolation can be achieved between individual pins of beam links carrying Tx or Rx RF signaling, as well as between digital and analog/RF signaling included on the same connector. Moreover, as noted above, Tx and Rx signals can be carried on different connectors, connector bodies/sections in a common connector assembly, or other isolation configurations leading to further (e.g., 80 dB) isolation among Tx/Rx signaling for an ESA. In one example implementation, a first connector section and a second connector section each have a signal arrangement comprising grounded connections forming a perimeter about a staggered pattern of connections carrying radio frequency signaling and having a selected quantity of grounded connections between each of the connections carrying the radio frequency signaling. This can enable concurrent usage of the same ESA panel for Tx and Rx signaling, further reducing size, weight, and cost of satellites or other vehicles that employ ESAs.

Thus, the CCA and PCB examples herein provide for signal routing among various RF assemblies. In one example, an RF assembly includes stripline links configured to carry radio frequency signals routed by a first circuit board to a connector configured to couple to a mating connector on a second circuit board, and the connector couples the radio frequency signals to the second circuit board over associated connector contacts. The example RF assembly can also include a connection arrangement for the connector comprising a perimeter of radio frequency ground connections surrounding a set of radio frequency connections configured to carry the radio frequency signals, with each of the radio frequency connections of the set spaced apart within the perimeter by additional instances of the radio frequency ground connections such that a target signal isolation among individual ones of the radio frequency signals is established. The RF assembly can include coaxial radio frequency links having a first quantity and carrying the radio frequency signals coupled to stripline links having a second quantity larger than the first quantity and associated with a beamforming network. The stripline links can comprise traces on or in the first circuit board configured to have an impedance of 5052. The connector and the mating connector can form a generally 90° connection angle arrangement between the first circuit board and the second circuit board. The second circuit board can comprise further stripline links configured to route the radio frequency signals over the second circuit board to an additional mating connector on a third circuit board. The second circuit board can comprise further stripline links configured to route the radio frequency signals over the second circuit board to radio frequency waveguide components or antenna aperture components.

Figure 9:
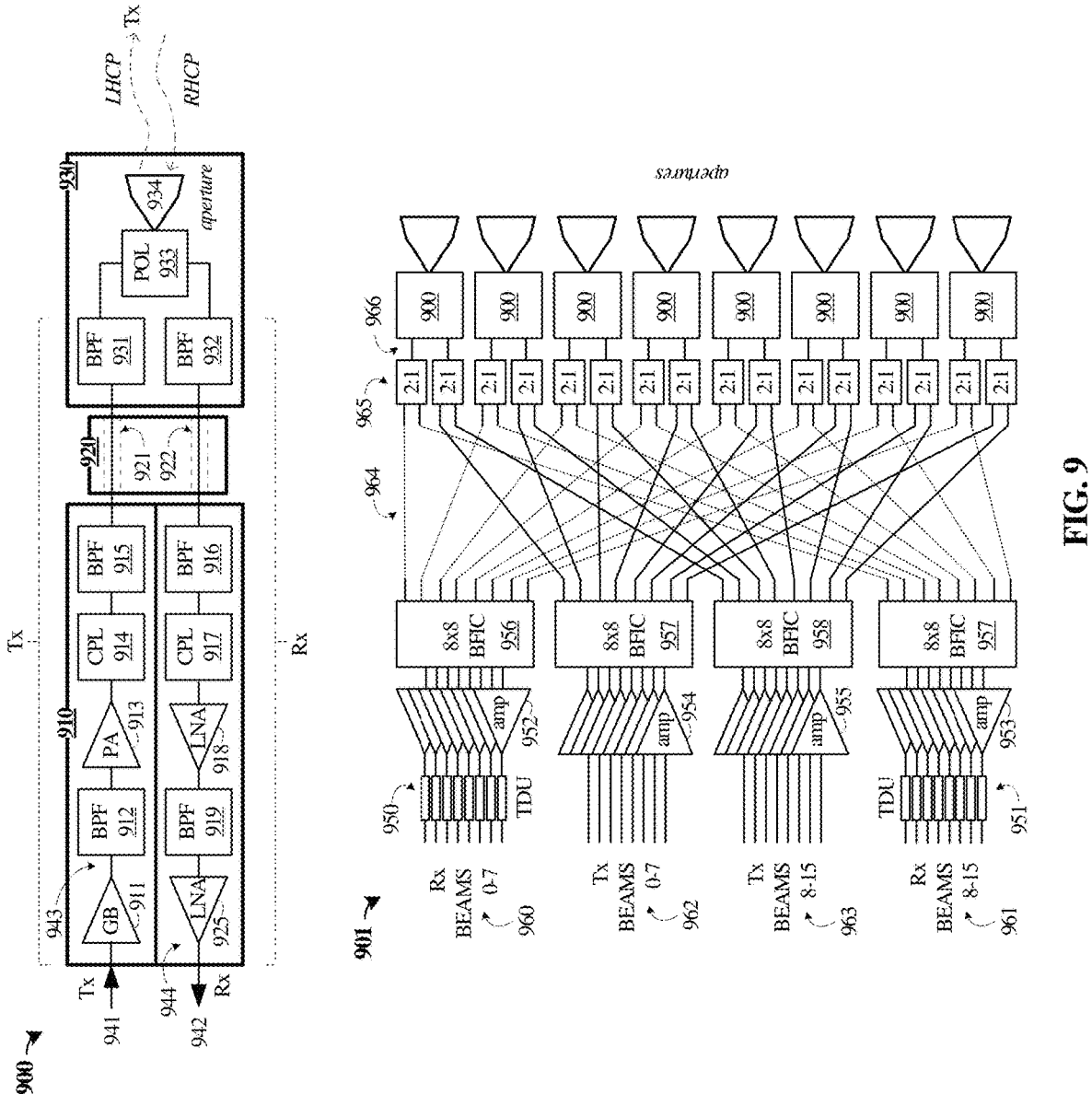
FIG. 9 illustrates schematic block diagrams for RF signaling in an antenna assembly in an implementation.

FIG. 9 illustrates schematic block diagrams for RF signaling in an antenna assembly in an implementation. System 900 illustrates a schematic block diagram for a horn subassembly for a selected beam for a full duplex transmit and receive subarray. System 901 illustrates a schematic block diagram for an entire subarray for a full duplex transmit and receive subarray. Systems 900-901 can comprise examples of subarrays 120, although variations are possible. Various control signaling is omitted from FIG. 9 for clarity, but the various elements can include control interfaces, telemetry interfaces, calibration interfaces, and other various interfaces, which can be handled over a shared communication link, such as SPI, among others.

Turning first to system 900, amplifier-filter module 910, adapter section 920, and aperture section 930 are included. Amplifier-filter module 910 includes a transmit (Tx) portion (upper pathway) corresponding to link 941, and a receive (Rx) portion (lower pathway) corresponding to link 942. Link 941-942 comprise coaxial RF links which are coupled to corresponding stripline links 966 of a corresponding subarray CCA. Elements of amplifier-filter module 910 can be included in segregated conductive cavities or enclosures formed within the structure of amplifier-filter module 910, such as segregated on different sides of body of amplifier-filter module 910. Thus, Tx components of amplifier-filter module 910 are included in cavity 943 and Rx components of amplifier-filter module 910 are included in cavity 944.

The Tx pathway includes link 941, gain block (GB) 911, bandpass filter (BPF) 912, power amplifier (PA) 913, coupler (CPL) 914, and BPF 915. The Tx pathway further transits through aperture/waveguide 921 in adapter plate 920 to reach aperture section 930. The Tx pathway in aperture section 930 includes BPF 931, polarizer (POL) 933, and horn aperture 934. Polarizer 933 establishes left-hand circular polarization (LHCP) for Tx signaling.

The Rx pathway includes horn aperture 934, polarizer 933, and BPF 932 in aperture section 930. The Rx pathway transits through aperture/waveguide 922 in adapter plate 920 to reach amplifier-filter module 910. The Rx pathway further includes BFP 916, CPL 917, low noise amplifier (LNA) 918, BPF 919, LNA 925, and link 942. Polarizer 933 establishes right-hand circular polarization (RHCP) for Rx signaling.

System 901 is shown including several instances of system 900 (right hand side) and are coupled to a beam-forming and signal distribution network upstream from the instances of system 900. Eight instances of system 900 are included, forming a subarray, such as subarrays 120 discussed herein. The full duplex subarray includes eight (8) horn elements which collectively form sixteen (16) independent Rx beams in RHCP and sixteen (16) independent Tx beams in LHCP. The full duplex subarray beams can be configured to operate in a time division multiple access (TDMA) mode with all beams active for a period of time followed by a mute cycle for a further period of time. This pattern can then be repeated at a selected hop rate.

The full duplex subarray includes eight (8) filter/polarizer/horn assemblies and eight (8) amplifier/filter modules (e.g., system 900), and a CCA with all digital command and control, RF distribution, and point-of-load power conversion. System 901 also includes four (4) 8×8 beamforming integrated circuits (BFICs), two of which are coupled to Tx signaling, and two of which are coupled to Rx signaling. This particular beamforming configuration includes coupling two Rx and two Tx beams in a 2:1 combiner/divider (965) for each aperture, such as shown for beam connections 964. On Rx signaling, corresponding dividers 965 feed into associated BFICs for beamforming handling and transfer to upstream receiver systems, including amplifier (amp) 952-953 and programmable time delay units (TDUs) 950-951 that provide Rx beams 0-7 (960) and Rx beams 8-15 (961). On Tx signaling, Tx beams 0-7 (962) and Tx beams 8-15 (963) are fed to amplifiers 954-955 and into associated BFICs for beamforming and transfer to associated combiners 965. Beamforming circuitry can thus include TDUs 950-951, amplifiers 952-955, BFICs 956-958, beam connections 964, and combiner/dividers 965. Links 960-964 can comprise stripline radio frequency links that carry input/output radio frequency signaling for an antenna subarray/assembly between a multi-connection non-coaxial connector (e.g., digital connector) and beamforming circuitry.

Although not shown in FIG. 9 for clarity, various power monitors and calibration links can be included for Tx and Rx signaling and components. These power monitors and calibration links can be controlled by SPI links form a controller and provide telemetry to a controller included on an associated L2 CCA. Moreover, these SPI links can configure BFICs, amplifiers, filters, and the like, to operate according to selected characteristics or parameters. Also, various CCAs can be included that comprise one or more high-speed high-density digital type of connectors over which the various RF signals of FIG. 9 are transported among and to systems 900 over links 941-942. Digital beamforming and distribution control systems, which include the BFICs, combiners, dividers, amplifiers, filters, polarizers, and such, can include various digital control signaling, such as the aforementioned SPI signaling. Subarray distribution FPGAs can be included on each subarray CCA which communicates with several BFICs, TDUs, and control parameters to control power amplifier gains, power monitors, beam weighting adjustments, time delays, and other parameters or characteristics.

Figure 10:
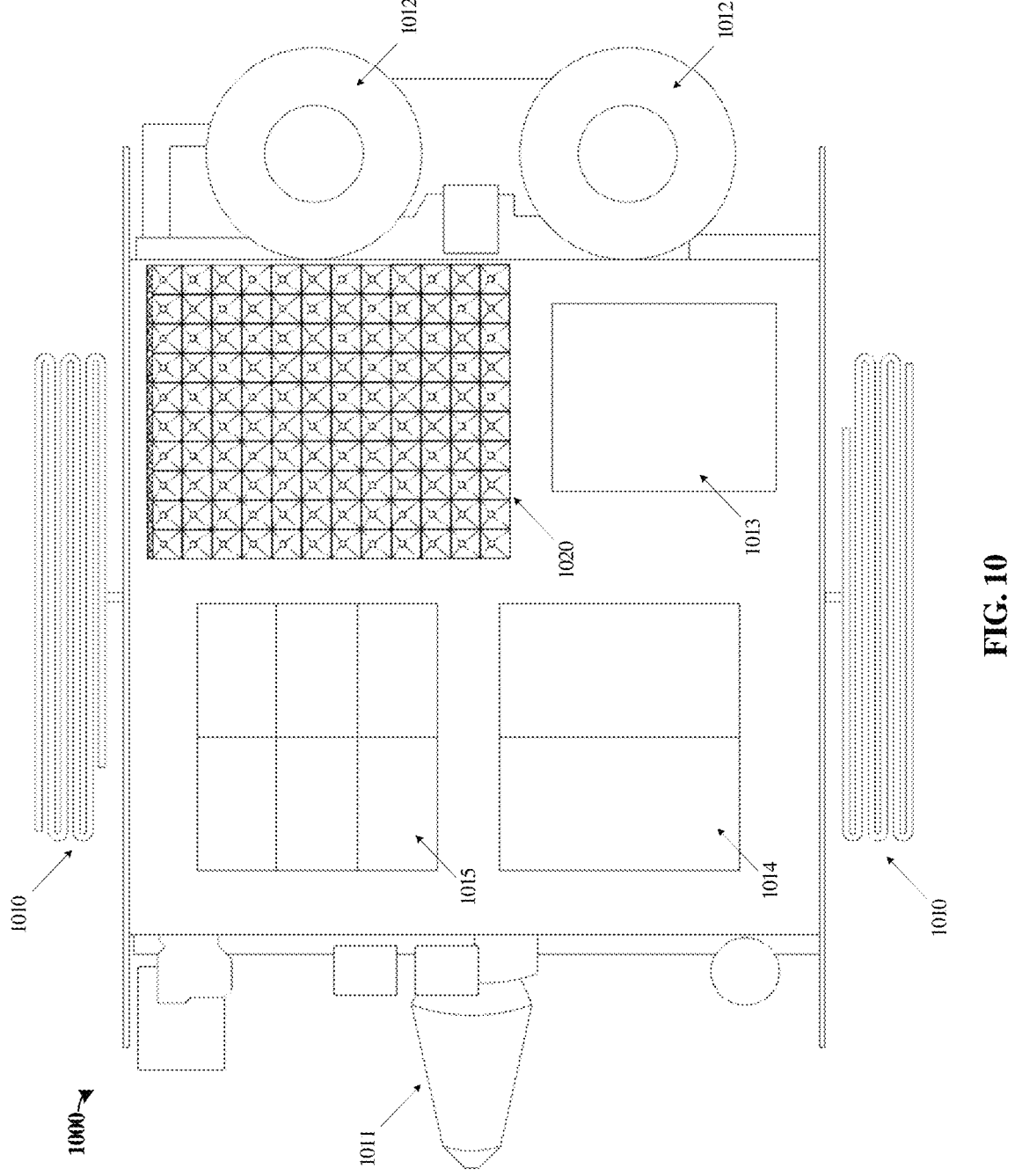
FIG. 10 illustrates an antenna assembly employed on a satellite in an implementation.

FIG. 10 illustrates antenna assembly 1020 employed on a satellite in an implementation. Specifically, satellite 1000 includes various on-board components and payloads. These can include payloads and components for various purposes, such as propulsion, orientation, power generation (e.g., solar panels 1010), thermal regulation (e.g., radiator panels, heat pipes), RF or optical communication arrays, sensors, reaction systems, and other components. Although not limited to the examples shown in FIG. 10, satellite 1000 includes RF antennas and arrays 1011-1015. Also, antenna array 1020 is included as an example of the full duplex antenna arrays discussed herein, such as antenna array 110.

In operation, satellite 1000 can be deployed into an orbit about a central body or into a trajectory in space, and antenna array 1020 can perform various Tx/Rx communications. In one example, satellite 1000 is deployed into a geostationary orbit or geosynchronous equatorial orbit (GEO), and the side of satellite 1000 which houses antenna array 1020 can be on an Earth-facing or nadir side for satellite-to-ground communications. Other configurations are possible, such as for satellite-to-satellite communications, satellite-to-craft communications, and other configurations. When the side of satellite 1000 that houses antenna array 1020 comprises a nadir face, then thermal radiator panels might be included such that heat can be radiated away from satellite 1000 at non-Earth facing sides. As discussed herein for antenna array 110, heat pipes or thermal rails can be coupled thermally and mechanically to components of antenna array 1020 for transfer of thermal energy away from antenna array 1020. This can provide for thermal regulation of antenna array 1020 to establish a target operating temperature range. Moreover, this target operating temperature range can be of a different temperature range than other components of satellite 1000, such as RF antennas and arrays 1011-1015. In this manner, a segregated thermal island can be established for antenna array 1020, which can further enhance operational characteristics of the full duplex and compact integrated configuration.

Satellite constellations can be deployed including many instances of satellite 1000 or other satellites. Various orbital configurations can include geostationary orbits or geosynchronous equatorial orbits (GEO), geosynchronous orbits (GSO), low-earth orbits (LEO), medium-earth orbits (MEO), high-earth orbits, polar orbits, self-orbiting constellation arrangements without a central body, orbits about a Lagrange point, or orbits about any central body including planets, stars, asteroids, comets, moons, other satellites, or spacecraft.

Figure 11:
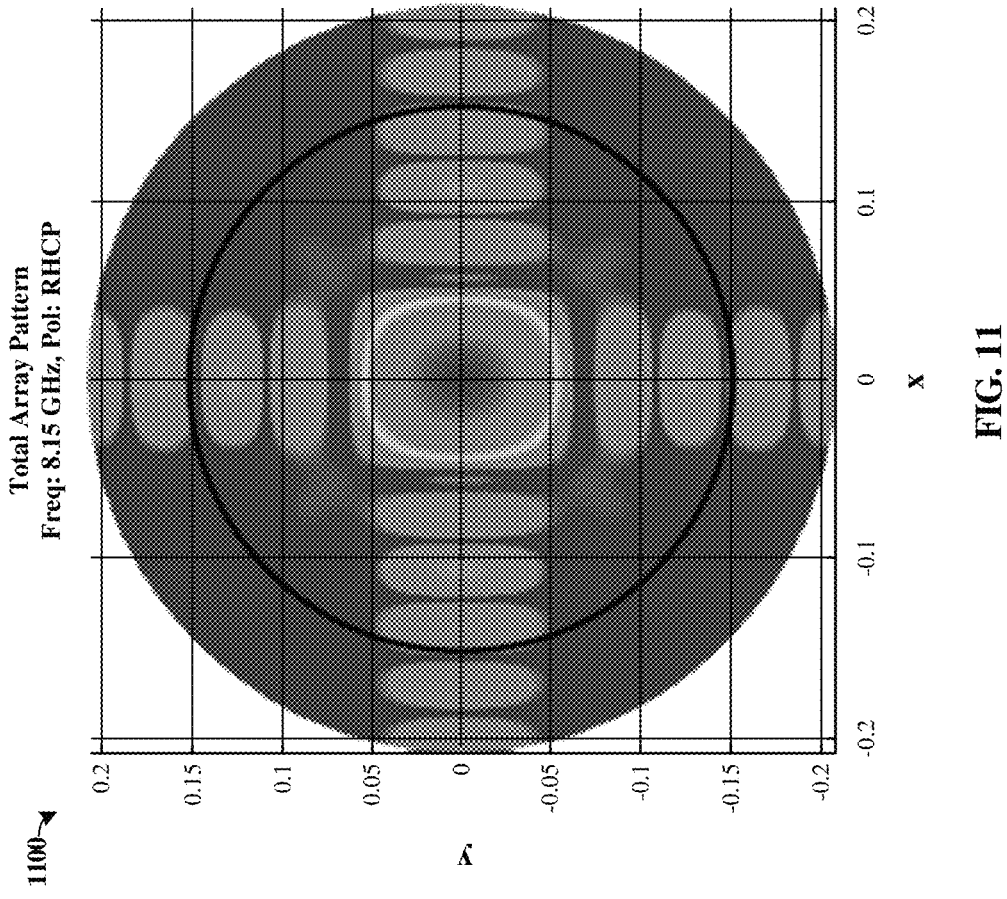
FIG. 11 illustrates an example antenna array radiation pattern in an implementation.

FIG. 11 illustrates an example antenna array radiation pattern in an implementation. Specifically, FIG. 11 includes radiation pattern graph 1100 for an antenna array, such as antenna array 110 or 1020 discussed herein. In this example, an Rx RHCP pattern at 8.15 GHZ (X band) is shown for an entire array of 120 aperture elements, with distances/dimensions labeled for the 'x' and 'y' axes in meters. As can be seen, beam alignment in the 'x' and 'y' axes is generally symmetrical and off-lobe energy is kept below target intensity levels. Similar performance is provided for Tx LHCP operations.

The examples herein can provide for enhanced full duplex Tx/Rx operation from a shared set of antenna apertures forming an antenna array. Various beamforming configurations can be established with ESA functionality for both Tx and Rx signaling. The subarray can provide a center of each steerable beam to be independently scanned greater than +8.7° from boresight while providing comparable or better axial ratio and scan loss performance as compared to traditional ESA topologies. A beam can operate contiguously, apart, or overlapping to any other beam and its position can be selected irrespective of the position of any other beam. Moreover, the smallest half power Rx beamwidth can be provided to be less than approximately 10 degrees in the short axis and approximately 8 degrees in the long axis. Each radiating element can provide an aperture efficiency greater than 80% across selected Tx and Rx frequency bands.

Thus, the examples herein provide example implementations of enhanced full duplex antenna arrays and associated subarrays with distributed/agile beamformer and TDUs providing robust beam shaping, steering and anti-jamming (AJ)/beam nulling capability without compromising G/T and EIRP performance. Moreover, the examples herein can provide dedicated four (4) RF geolocation quadrant beams at the ESA level which enables monopulse beamforming, emitter location and communications beam AJ nulling through advanced beam optimization digital processing. The examples herein can further provide highly integrated, high tolerance RF stripline distribution and combining for RF signaling instead of coaxial links. This configuration eliminates all array RF coaxial intra-array coupling assemblies which reduces mass, reduces ESA integration time, and eliminates phase and amplitude tuning which minimizes phase and amplitude tracking errors. Subarray CCAs can provide high tolerance stripline matching and parts placement including RF connectors to minimize phase and amplitude errors. Digital command and control can be incorporated at the ESA level, which minimizes digital interfaces that further reduces part count and mass. This highly flexible solution features multiple integrated subarrays, each comprising an 8-element aperture, amplifier-filter modules, mixed signal CCA with independent Tx/Rx functionality, and a command-and-control digital Backbone (CCB). The example arrays herein also incorporate on-PCB L1/L2 RF distribution and combining networks, effectively eliminating the need for numerous subarray RF cable assemblies. The L2 CCAs encompass functionalities such as geolocation beamforming, beam-level automatic gain control (AGC), and digital command and control capabilities.

Particular RF assemblies employ high-speed high-density digital connectors herein, such as antenna assembly 110. The high-speed high-density digital connectors for carrying RF signaling and associated stripline PCB-based RF signal routing can be applied to any suitable RF system, RF assembly, or RF sub-assembly which can vary from the RF assemblies discussed herein.

The various CCAs herein comprise printed circuit boards (PCBs) having a stackup of laminated circuit layers to form various circuit structures. The stackup of layers can be formed using PCB lamination and manufacturing operations, such as a series of lamination, plating, bonding, and etching steps. Conductive and laminate or "pre-preg" layers can be included. The laminate or pre-preg materials can include pre-impregnated resin materials having a substrate (e.g., cloth, fiberglass, carbon fiber, or polyaramid, or other materials) with an embedded resin. Laminate materials can comprise high-frequency compatible circuit board laminate/substrate materials, such as Tachyon® 100G materials, Astra® MT77 materials, or Rogers RO3003™ materials. Example conductive or conductor materials used to make ground planes, power planes, routes, traces, vias, striplines, microstrips, and feed element features include copper, copper alloys, gold, silver, aluminum, or other printed circuit board compatible conductor materials. Various stripline routing can be employed, such as symmetric, differential, asymmetric, broadside, embedded, and surface (microstrip), among others.

The frequency ranges for the RF links, connectors, antennas, components, configurations, systems, and arrangements herein include various RF bands, such as microwave frequencies capable of transiting RF waveguide structures. Different frequency bands can be supported by similar architectures as shown herein, with associated geometry scaling to suit the selected frequency ranges. While the examples herein cover portions of the RF bands noted above, examples might include the X band (approximately 8 to 12 GHZ), or the Ka band and Ku band or other portions of the K bands (approximately 12 to 40 GHZ). Other examples might be configured to support frequency ranges, or portions thereof, corresponding to the IEEE bands of S band, L band, C band, X band, Ku band, K band, Ka band, V band, W band, among others, including combinations thereof. Other example RF frequency ranges and service types include ultra-high frequency (UHF), super high frequency (SHF), extremely high frequency (EHF), or other parameters defined by different organizations. In addition, various frequency bands associated with communication technology, such as Wi-Fi and 4G/5G cellular communications can be employed. These include the IEEE 802.11 family of frequency bands (Wi-Fi), and the 4G/5G broadband cellular network frequency bands including the low band (600 to 700 MHZ), mid band (1.7 GHZ to 2.5 GHZ), high band (24 to 100 GHz (mmWave)) defined by the 3rd Generation Partnership Project (3GPP) and other organizations.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The various materials and manufacturing processes discussed herein are employed according to the descriptions above. However, it should be understood that the disclosures and enhancements herein are not limited to these materials and manufacturing processes, and can be applicable across a range of suitable materials and manufacturing processes. Thus, the descriptions and figures included herein depict specific implementations to teach those skilled in the art how to make and use the best options. For the purpose of teaching inventive principles, some conventional aspects have been simplified or omitted. Those skilled in the art will appreciate variations from these implementations that fall within the scope of this disclosure. Those skilled in the art will also appreciate that the features described above can be combined in various ways to form multiple implementations.

What is claimed is:

1. An apparatus, comprising:
   a first printed circuit board comprising coaxial radio frequency connectors configured to couple radio frequency signals to stripline links arranged to route the radio frequency signals to a connector configured to couple to a mating connector on a second printed circuit board;
   wherein connections of the connector are arranged to carry the radio frequency signals to the second printed circuit board using at least a connection arrangement having a perimeter of radio frequency ground connections surrounding a set of radio frequency connections configured to carry the radio frequency signals, with each of the radio frequency connections of the set spaced apart within the perimeter by additional instances of the radio frequency ground connections such that a target signal isolation among individual ones of the radio frequency signals is established.

2. The apparatus of claim 1, wherein the stripline links comprise traces of the first printed circuit board configured to have a characteristic impedance of approximately 50 ohms and the connector comprises a characteristic impedance different than the stripline links;

wherein impedance matching elements are provided between the stripline links and the radio frequency connections of the connector.

3. The apparatus of claim 1, wherein at least one among the connector and the mating connector comprise a right-angle connection arrangement between the first printed circuit board and the second printed circuit board.

4. The apparatus of claim 1, comprising:

the second printed circuit board comprises further stripline links configured to route the radio frequency signals from the mating connector over the second printed circuit board to an additional connector of the second printed circuit board to a third printed circuit board comprising an antenna subarray having beamforming circuitry driving stripline-to-coaxial connections that individually couple beamformed radio frequency signals to waveguide components.

5. The apparatus of claim 1, wherein the mating connector is positioned on the second printed circuit board comprising a pluggable modular aperture antenna subarray having beamforming circuitry coupled to the radio frequency signals.

6. The apparatus of claim 1, wherein the connector and the mating connector each comprise an open pin field array press fit connector.

7. The apparatus of claim 1, wherein the connector and the mating connector each comprise a high-density digital connector.

8. The apparatus of claim 1, wherein the connector is configured to isolate receive radio frequency signaling from transmit radio frequency signaling by at least providing a first connector section carrying receive radio frequency signaling and a second connector section carrying transmit radio frequency signaling.

9. The apparatus of claim 1, wherein the connector couples the radio frequency signals, and at least one among power connections and digital communications to the mating connector.

10. The apparatus of claim 1, wherein the first printed circuit board is configured to segregate receive portions of the radio frequency signals from transmit portions of the radio frequency signals by at least having a first side comprising circuitry or routes corresponding to the receive portions a second side comprising circuitry or routes corresponding to the transmit portions; and wherein the receive portions and the transmit portions are routed to the connector positioned on a side of the printed circuit board opposite of coaxial connectors carrying input/output radio frequency signals.

11. A method of coupling radio frequency signaling among printed circuit boards, the method comprising:

on a first printed circuit board, forming individual stripline links arranged to carry a plurality of radio frequency signals between coaxial radio frequency connectors and a connector configured to couple the plurality of radio frequency signals to a mating connector on a second printed circuit board; and wherein the connector comprises a connection arrangement having a perimeter of radio frequency ground connections surrounding a set of radio frequency connections configured to carry the plurality of radio frequency signals, with each of the radio frequency connections of the set spaced apart within the perimeter by additional instances of the radio frequency ground connections such that a target signal isolation among individual ones of the plurality of radio frequency signals is established.

12. The method of claim 11, wherein the coaxial connectors and the stripline link are configured to have approximately a 50 ohm characteristic impedance and the connector comprises a different characteristic impedance; and wherein impedance matching elements are provided between the stripline links and the radio frequency connections of the connector.

13. The method of claim 11, wherein at least one among the connector and the mating connector comprise a right-angle connection arrangement between the first printed circuit board and the second printed circuit board.

14. The method of claim 11, wherein the connector and the mating connector each comprise an open pin field array press fit connector.

15. The method of claim 11, wherein the connector and the mating connector each comprise a high-density digital connector.

16. The method of claim 11, wherein the connector is configured to isolate receive radio frequency signaling from transmit radio frequency signaling by at least providing a first connector section carrying receive radio frequency signaling and a second connector section carrying transmit radio frequency signaling.

17. The method of claim 11, wherein the connector is configured to couple the plurality of radio frequency signals and at least one among power connections and digital communications to the mating connector.

18. An antenna subarray, comprising:

a printed circuit board comprising stripline links arranged to carry a set of radio frequency signals from a connector to beamforming circuitry driving stripline-to-coaxial connections that individually couple beamformed radio frequency signals to waveguide components configured to drive a plurality of aperture antennas; and wherein the connector comprises a connection arrangement having a perimeter of radio frequency ground connections surrounding the set of radio frequency connections, with each of the radio frequency connections of the set spaced apart within the perimeter by additional instances of the radio frequency ground connections such that a target signal isolation among individual ones of the set is established.

* * * * *